United States Patent
Lee et al.

(10) Patent No.: US 9,159,751 B2
(45) Date of Patent: Oct. 13, 2015

(54) UNIT PIXEL OF IMAGE SENSOR AND IMAGE SENSOR INCLUDING THE SAME

(71) Applicant: Samsung Electronics Co., Ltd., Suwon-si, Gyeonggi-do (KR)

(72) Inventors: Jun-Taek Lee, Hwaseong-si (KR); Sang-Il Jung, Hwaseong-si (KR); Yi-Tae Kim, Hwaseong-si (KR); Woon-Phil Yang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 29 days.

(21) Appl. No.: 14/088,793

(22) Filed: Nov. 25, 2013

(65) Prior Publication Data

US 2014/0217474 A1 Aug. 7, 2014

(30) Foreign Application Priority Data

Feb. 5, 2013 (KR) .................. 10-2013-0012831

(51) Int. Cl.
*H01L 29/768* (2006.01)
*H01L 27/146* (2006.01)

(52) U.S. Cl.
CPC ...... *H01L 27/14605* (2013.01); *H01L 27/1463* (2013.01); *H01L 27/14609* (2013.01); *H01L 27/14641* (2013.01)

(58) Field of Classification Search
CPC .................. H01L 27/14643; H01L 27/14605; H01L 27/1463
USPC ......... 257/231–233, 225, 229, 292–294, 462, 257/465
See application file for complete search history.

(56) References Cited

U.S. PATENT DOCUMENTS

| | | | |
|---|---|---|---|
| 7,579,208 B2 | 8/2009 | Park | |
| 7,741,143 B2 | 6/2010 | Paik et al. | |
| 7,956,394 B2 * | 6/2011 | Lee | 257/294 |
| 2005/0274874 A1 * | 12/2005 | Nozaki et al. | 250/208.1 |
| 2006/0084195 A1 * | 4/2006 | Lyu | 438/48 |
| 2008/0210984 A1 | 9/2008 | Kawamura | |
| 2010/0264464 A1 | 10/2010 | Lee | |
| 2010/0267184 A1 * | 10/2010 | Noh | 438/58 |

FOREIGN PATENT DOCUMENTS

| | | |
|---|---|---|
| KR | 10-2005-0041609 A | 5/2005 |
| KR | 10-2005-0060650 A | 6/2005 |
| KR | 10-2005-0097147 A | 10/2005 |
| KR | 10-2005-0097152 A | 10/2005 |
| KR | 10-2008-0010834 A | 1/2008 |

\* cited by examiner

*Primary Examiner* — Dung Le
(74) *Attorney, Agent, or Firm* — Lee & Morse, P.C.

(57) ABSTRACT

A unit pixel of an image sensor includes a photoelectric conversion region, a floating diffusion region, and a transfer gate. The photoelectric conversion region is in an active region defined by an isolation region of a semiconductor substrate. The photoelectric conversion region generates electric charges corresponding to incident light. The transfer gate transfers the electric charges to the floating diffusion region, which is located in the active region. The transfer gate includes first and second portions divided relative to a reference line, and at least one of the first or second portions does not overlap the isolation region.

27 Claims, 26 Drawing Sheets

UNIT PIXEL OF IMAGE SENSOR AND IMAGE SENSOR INCLUDING THE SAME

CROSS-REFERENCE TO RELATED APPLICATION

Korean Patent Application No. 10-2013-0012831, filed on Feb. 5, 2013, and entitled: "Unit Pixel of Image Sensor and Image Sensor Including the Same," is incorporated by reference herein in its entirety.

BACKGROUND

1. Field

One or more embodiments described herein relate to an image sensor.

2. Description of the Related Art

An image sensor is a device that transforms incident light to an electric signal. Examples include a charge coupled device (CCD) image sensor and a complementary metal oxide semiconductor (CMOS) image sensor. To improve sensing performance, a backside illuminated image sensor (BIS) has been developed that performs photoelectric transformation in response to incident light passing through a back surface of a semiconductor substrate.

SUMMARY

In accordance with one embodiment, a unit pixel of an image sensor includes a photoelectric conversion region in an active region defined by an isolation region of a semiconductor substrate, the photoelectric conversion region configured to generate electric charges corresponding to incident light; a floating diffusion region in the active region; and a transfer gate configured to transfer the electric charges to the floating diffusion region. The transfer gate is adjacent to the photoelectric conversion region and the floating diffusion region and includes first and second portions divided relative to a reference line in a second direction crossing a first direction. At least one of the first or second portions does not overlap the isolation region.

Also, the active region may include a first section having a corner-cut foursquare or rectangular shape; and a second section having a rectangular shape that extends in the second direction from a corner-cut edge of the first section.

Also, the reference line may divide the first and second sections equally in the second direction, and the transfer gate may be symmetrically arranged with respect to the line. The first and second portions of the transfer gate may not overlap the isolation region.

Also, the reference line may divide the first and second sections equally in the second direction, and the transfer gate may be asymmetrically arranged with respect to the line. The first portion of the transfer gate may partially overlap the isolation region and the second portion of the transfer gate does not overlap the isolation region. Also, the first portion of the transfer gate may not overlap the isolation region and the second portion of the transfer gate may partially overlap the isolation region. Also, the first section may include the photoelectric conversion region. Also, the second section may include the floating diffusion region.

Also, the photoelectric conversion region may be doped with impurities of a second conductivity type, and the semiconductor substrate may be doped with impurities of a first conductivity type different from the second conductivity type.

Also, the transfer gate may be on a first surface of the semiconductor substrate. A color filter may be located above the transfer gate and may correspond to the photoelectric conversion region; and a micro lens may be on the color filter and correspond to the photoelectric conversion region.

Also, the transfer gate may be on a first surface of the semiconductor substrate, and the unit pixel may includes a color filter on a second surface of the semiconductor substrate, the color filter corresponding to the photoelectric conversion region; and a micro lens on the color filter, the micro lens corresponding to the photoelectric conversion region.

In accordance with another embodiment, a unit pixel of an image sensor includes a floating diffusion region in an active region defined by an isolation region of a semiconductor substrate; a plurality of photoelectric conversion regions on the active region which is shared by the floating diffusion region, the photoelectric conversion regions configured to generate electric charges corresponding to incident light; and a plurality of transfer gates configured to transfer the electric charges to the floating diffusion region. The transfer gates are adjacent to the photoelectric conversion regions and the floating diffusion region, and each of the transfer gate include first and second portions divided relative to a reference line in a second direction crossing a first direction. At least one of the first or second portions does not overlap the isolation region.

Also, the plurality of photoelectric conversion regions may include first and second photoelectric conversion regions, and the active region may include: a first section including the first photoelectric conversion region; a second section including the first photoelectric conversion region; and a third section including the floating diffusion region and which is adjacent to the first and second sections. The plurality of transfer gates may include: a first transfer gate configured to transfer first electric charges in the first photoelectric conversion region to the floating diffusion region; and a second transfer gate configured to transfer second electric charges in the second photoelectric conversion region to the floating diffusion region.

Also, the first and second transfer gates may respectively receive first and second transfer control signals in a read operation mode, the first and second transfer control signals having different activation intervals.

Also, the plurality of photoelectric conversion regions may include first through fourth photoelectric conversion regions that are adjacent to each other in a two-by-two matrix form. The active region may include: a first section including the first photoelectric conversion region; a second section including the second photoelectric conversion region; a third section including the third photoelectric conversion region; a fourth section including the fourth photoelectric conversion region; and a fifth section including the floating diffusion region, the fifth section adjacent to the first through fourth sections.

Also, the plurality of transfer gates may include: a first transfer gate configured to transfer first electric charges in the first photoelectric conversion region to the floating diffusion region; a second transfer gate configured to transfer second electric charges in the second photoelectric conversion region to the floating diffusion region; a third transfer gate configured to transfer third electric charges in the third photoelectric conversion region to the floating diffusion region; and a fourth transfer gate configured to transfer fourth electric charges in the fourth photoelectric conversion region to the floating diffusion region.

In accordance with another embodiment, a unit pixel of an image sensor includes a photoelectric conversion region in an active region defined by an isolation region of a semiconductor substrate, the photoelectric conversion region configured to generate first electric charges to detect a distance from an object and second electric charges to detect a color of the object; a plurality of floating diffusion regions in the active region; and a plurality of transfer gates configured to transfer the first and second electric charges to the floating diffusion regions. The transfer gates are adjacent to the photoelectric conversion regions and the floating diffusion region, and each of the transfer gates includes first and second portions divided relative to a reference line in a second direction crossing to a first direction. At least one of the first and second portions does not overlap the isolation region.

Also, the active region may include: a first section having an eight-sided shape including four cut corners; and second through fifth sections having a rectangular shape, each of the second through fifth sections extending in a first or second diagonal direction relative to a respective one of the four corner-cut edges of the first section, the first section includes the photoelectric conversion region, and the second through fifth sections respectively include the first through fourth floating diffusion regions.

Also, the plurality of transfer gates may include: a first transfer gate configured to transfer electric charges in the photoelectric conversion region to the first floating diffusion region; a second transfer gate configured to transfer the electric charges in the photoelectric conversion region to the second floating diffusion region; a third transfer gate configured to transfer the electric charges in the photoelectric conversion region to the third floating diffusion region; and a fourth transfer gate configured to transfer the electric charges in the photoelectric conversion region to the fourth floating diffusion region. The first and the second floating diffusion regions may be configured to generate at least a depth signal to detect the distance from the object, and the third and fourth floating diffusion regions may be configured to generate a color signal to detect the color of the object. The first and second floating diffusion regions are symmetrically arranged with respect to the first diagonal direction, and the third and fourth floating diffusion regions are symmetrically arranged with respect to the second diagonal direction.

In accordance with another embodiment, an image sensor includes a pixel array including a plurality of unit pixels, the pixel array configured to generate an electrical signal in response to incident light; and a signal processor configured to process the electrical signal to generate image data, wherein each of the unit pixels includes: at least one photoelectric conversion region in an active region defined by an isolation region of a semiconductor substrate, the photoelectric conversion region configured to generate electric charges corresponding to the incident light; a floating diffusion region in the active region; and at least one transfer gate configured to transfer the electric charges to the floating diffusion region. The transfer gate may be adjacent to the photoelectric conversion region and the floating diffusion region, and the transfer gate may include first and second portions divided relative to a line in a second direction crossing a first direction. At least one of the first or second portions does not overlap the isolation region.

Also, the active region may include a first section having a corner-cut foursquare or rectangular shape; and a second section having a rectangular shape extending in the second direction from a corner-cut edge of the first section.

Also, the at least one photoelectric conversion region may include first and second photoelectric conversion regions, and the active region may include: a first section including the first photoelectric conversion region; a second section including the first photoelectric conversion region; and a third section including the floating diffusion region and which is adjacent to the first and second sections. The at least one transfer gate may include: a first transfer gate configured to transfer first electric charges in the first photoelectric conversion region to the floating diffusion region; and a second transfer gate configured to transfer second electric charges in the second photoelectric conversion region to the floating diffusion region.

Also, the at least one photoelectric conversion region may include first through fourth photoelectric conversion regions that are adjacent to each other in a two-by-two matrix form, and the active region may include: a first section including which the first photoelectric conversion region; a second section including the second photoelectric conversion region; a third section including the third photoelectric conversion region; a fourth section including the fourth photoelectric conversion region; and a fifth section including the floating diffusion region and which is adjacent to the first through fourth sections. The at least one transfer gate may include: a first transfer gate configured to transfer first electric charges in the first photoelectric conversion region to the floating diffusion region; a second transfer gate configured to transfer second electric charges in the second photoelectric conversion region to the floating diffusion region; a third transfer gate configured to transfer third electric charges in the third photoelectric conversion region to the floating diffusion region; and a fourth transfer gate configured to transfer fourth electric charges in the fourth photoelectric conversion region to the floating diffusion region.

In accordance with another embodiment, a unit pixel of an image sensor includes a substrate including an active region and an isolation region; a photoelectric conversion region, in the active region, to generate electric charges from incident light; a floating diffusion region in the active region; and a transfer gate between the photoelectric conversion region and the floating diffusion region, the transfer gate including a first area and a second area, wherein an axis through the photoelectric conversion region passes between the first and second area, and wherein at least one of the first or second areas does not overlap the isolation region.

Also, the first area and the second area may be substantially equal, or the first area may be different from the second area.

Also, the photoelectric conversion region includes first and second points, a distance between the first and second points is equal to or greater than a distance between any two other points in the photoelectric conversion region, and the axis passes through the first and second points.

Also, the floating diffusion region is coupled to the photoelectric conversion region through the transfer gate and is coupled to another photoelectric conversion region through another transfer gate.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
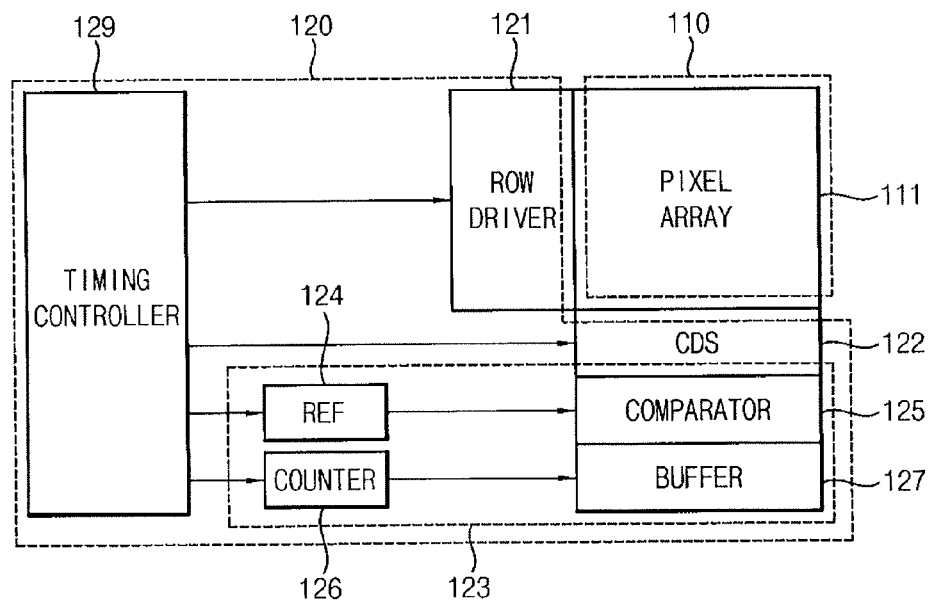
FIG. 1 illustrates an embodiment of a complementary metal-oxide semiconductor (CMOS) image sensor.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a complementary metal-oxide semiconductor (CMOS) image sensor 100 which includes a photoelectric conversion unit 110 and a signal processing unit 120.

The photoelectric conversion unit 110 generates electrical signals based on an incident light. The photoelectric conversion unit 110 may include a pixel array 111 where unit pixels are arranged in a matrix form. Detailed configurations of examples of a unit pixel will be described below with reference to FIGS. 2 through 5, FIGS. 7 through 18, FIG. 10 and FIGS. 23 through 25. The photoelectric conversion unit 110 may further include an infrared filter and/or a color filter.

The signal processing unit 120 may include a row driver 121, a correlated double sampling (CDS) unit 122, an analog-digital converting (ADC) unit 123, and a timing controller 129.

The row driver 121 is connected with each row of the pixel array 111. The row driver 121 may generate driving signals to drive each row. For example, the row driver 121 may drive a plurality of unit pixels included in the pixel array 111 row by row.

The CDS unit 122 performs a CDS operation by obtaining a difference between reset components and measured signal components using capacitors and switches, and outputs analog signals corresponding to effective signal components. The CDS unit 122 may include a plurality of CDS circuits that are connected to column lines, respectively. The CDS unit 122 may output the analog signals corresponding to the effective signal components column by column.

The ADC unit 123 converts the analog signals corresponding to the effective signal components into digital signals. The ADC unit 123 may include a reference signal generator 124, a comparison unit 125, a counter 126 and a buffer unit 127. The reference signal generator 124 may generate a reference signal (e.g., a ramp signal having a slope), and provide the reference signal to the comparison unit 125. The comparison unit 125 may compare the reference signal with the analog signals corresponding to the effective signal components, and output comparison signals having respective transition timings according to respective effective signal component column by column. The counter 126 may perform a counting operation to generate a counting signal, and provide the counting signal to the buffer unit 127. The buffer unit 127 may include a plurality of latch circuits (e.g., static random access memory (SRAM)) respectively connected to the column lines. The buffer unit 127 may latch the counting signal of each column line in response to the transition of each comparison signal, and output the latched counting signal as image data.

In at least one example embodiment, the ADC unit 123 may further include an adder circuit that adds the analog signals output from the CDS unit 122. The buffer unit 127 may include a plurality of single line buffers.

The timing controller 129 controls operation timings of the row driver 121, the CDS unit 122, and the ADC unit 123. The timing controller 129 may provide timing signals and control signals to the row driver 121, the CDS unit 122, and the ADC unit 123.

The CMOS image sensor 100 operates alternatively in two modes: a first operation mode and a second operation mode. The first operation mode may be referred to as an integration mode, and the second operation mode may be referred to as a readout mode. The CMOS image sensor may perform different operations depending on the operation modes. For example, during the first operation mode, image information on an object to be captured is obtained by collecting charge carriers (e.g., electron-hole pairs) in photoelectric conversion regions proportional to intensity of incident lights through an open shutter of the CMOS image sensor. During the second operation mode, which, for example, may come after the first operation mode, the shutter is closed and the image information in a form of charge carriers is converted into electrical signals.

Figure 2:
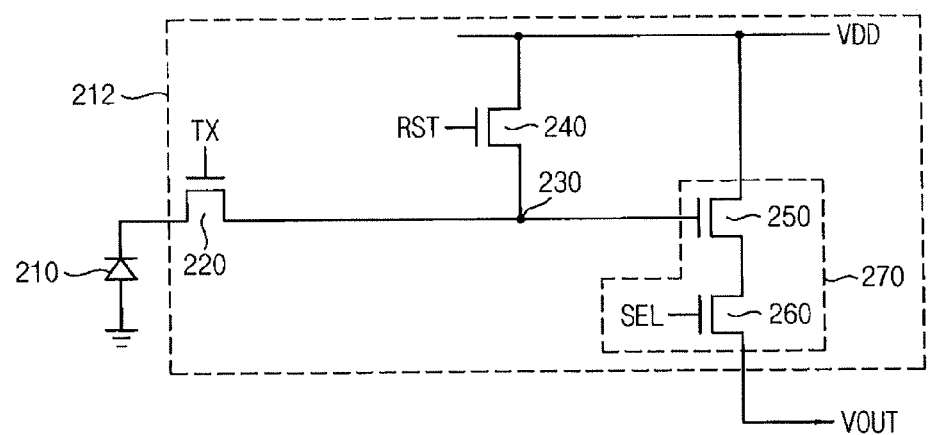
FIG. 2 illustrates an example of a unit pixel in the image sensor of FIG. 1.

FIG. 2 illustrates an example of a circuit diagram of a unit pixel 200 in the CMOS image sensor of FIG. 1. Referring to FIG. 2, unit pixel 200 may include a photoelectric conversion element 210 and a signal generation unit 212.

The photoelectric conversion element 210 performs a photoelectric conversion operation. For example, the photoelectric conversion element 210 may convert incident light into electric charges during the integration mode. The photoelectric conversion element 210 may include, for example, a photo diode, a photo transistor, a photo gate, a pinned photo diode (PPD), or a combination thereof.

The signal generation unit 212 generates an electric signal based on the electric charges generated by the photoelectric conversion operation. The unit pixel 200 may have various structures including, for example, one-transistor structure, three-transistor structure, four-transistor structure, five-transistor structure, a structure where some transistors are shared by a plurality of unit pixels, etc. An example of a four-transistor structure of unit pixel 200 is shown in FIG. 2. In this case, the signal generation unit 212 may include a transfer transistor 220, a reset transistor 240, a drive transistor 250, a select transistor 260, and a floating diffusion node 230.

The transfer transistor 220 may include a first electrode connected to the photoelectric conversion element 210, a second electrode connected to the floating diffusion node 230, and a gate electrode applied to a transfer control signal TX. The reset transistor 240 may include a first electrode applied to a power supply voltage VDD, a second electrode connected to the floating diffusion node 230, and a gate electrode applied to a reset signal RST. The drive transistor 250 may include a first electrode applied to the power supply voltage VDD, a gate electrode connected to the floating diffusion node 230, and a second electrode. The select transistor 260 may include a first electrode connected to the second electrode of the drive transistor 250, a gate electrode applied to a select signal SEL, and a second electrode providing an output voltage VOUT. The drive transistor 250 and the select transistor 260 may be part of an output unit 270.

Although the unit pixel 200 having four-transistor structure is illustrated in FIG. 2 for convenience of illustration, the unit pixel included in the CMOS image sensor may have various structures that include the photoelectric conversion element and the floating diffusion node.

Figure 3:
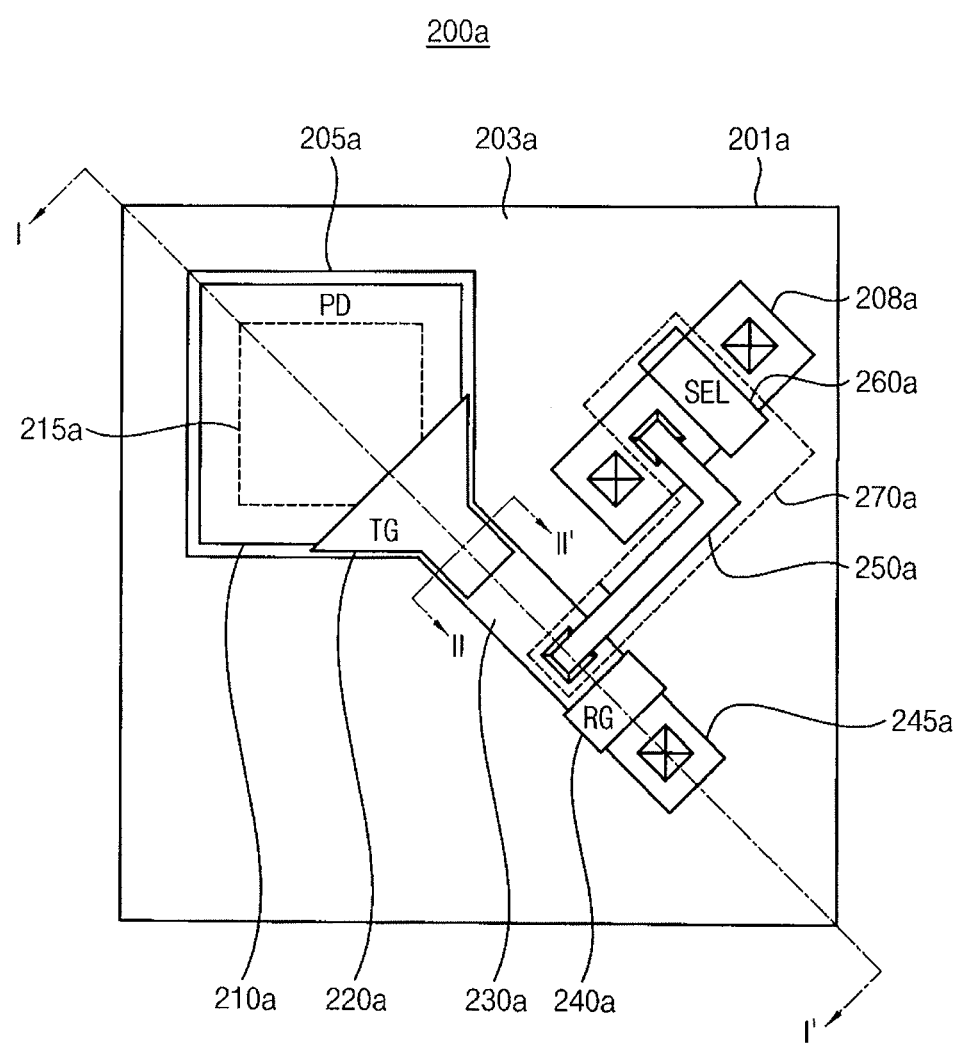
FIG. 3 illustrates another view of the unit pixel in FIG. 2.

FIG. 3 illustrates a plan view of an example of the unit pixel 200a included in the CMOS image sensor of FIG. 2. Referring to FIG. 3, a unit pixel 200a may include a photoelectric conversion region 210a, a floating diffusion region 230a and a transfer gate 220a. The unit pixel 200a may further include a reset gate 240a, a reset drain 245a, and an output unit 270a. In addition, the photoelectric conversion region 210a, the transfer gate 220a, the floating diffusion region 230a, the reset gate 240a, the reset drain 245a, and the output unit 270a may be formed in or over a semiconductor substrate 201a. In addition, the unit pixel 200a may include an impurity region 215a formed over the photoelectric conversion region. The impurity region 215a may be doped with impurities of a same conductivity type as the semiconductor substrate 201a and may be more heavily doped than the semiconductor substrate 201a.

The semiconductor substrate 201a may include first and second active regions 205a and 208a defined by isolation region 203a. The photoelectric conversion region 210a, the floating diffusion region 230a, and the reset drain 245a may be formed in the first active region 205a. The photoelectric conversion region 210a may be formed within the first active region 205a. The photoelectric conversion region 210a may collect electric charges (e.g., electrons) from electron-hole pairs generated by the incident light on the semiconductor substrate 201a. The photoelectric conversion element 210a may include, for example, a photo diode, a photo transistor, a photo gate, a pinned photo diode (PPD), or a combination thereof.

The impurity region 215a may be doped more heavily with p-type impurities than the semiconductor substrate 201a. The impurity region 215a may suppress generation of dark current because elections generated in dark situation are combined with holes in the impurity region 215a and vanish. Therefore, the impurity region 215a may be omitted in the unit pixel 200a.

The transfer gate 220a is formed over the semiconductor substrate 201a. The transfer gate 220a may be formed adjacent to the photoelectric conversion region 210a and the floating diffusion region 230a. The transfer gate 220a may include first and second portions divided by a central line (also referred to as "reference line") in a second direction perpendicular to a first direction with a longitudinal direction (or, the first direction crosses the second direction). At least one of the first and second portions may not overlap the isolation region 203a. The transfer gate 220a may transfer the electric charges collected by the photoelectric conversion region 210a to the floating diffusion region 230a.

The floating diffusion region 230a is formed in the first active region 205 and accumulates the electric charges transferred by the transfer gate 220a.

The reset gate 240a is formed over the semiconductor substrate 201a. The reset gate 240a may be disposed between the floating diffusion region 230a and the reset drain 245a receiving the power supply voltage VDD. The reset gate 240a may reset the floating diffusion region 230a in response to the reset signal RST. For example, after the reset operation, an electric potential level (i.e., a voltage level) of the floating diffusion region 230a may correspond to the level of the power supply voltage VDD. The floating diffusion region 230a and the output unit 270a may be electrically coupled via a contact unit.

The output unit 270a is formed over the semiconductor substrate 201a. The output unit 270a may output the electric signal corresponding to the electric charges accumulated in the floating diffusion region 230a. The output unit 170a may include a drive transistor 250a for amplifying the voltage of the floating diffusion region 230a, and a select transistor 260a for outputting the voltage amplified by the drive transistor 250a to a column line. Drain regions and source regions of the drive transistor 205a and the select transistor 260a may be formed in the second active region 208a.

Figure 4:
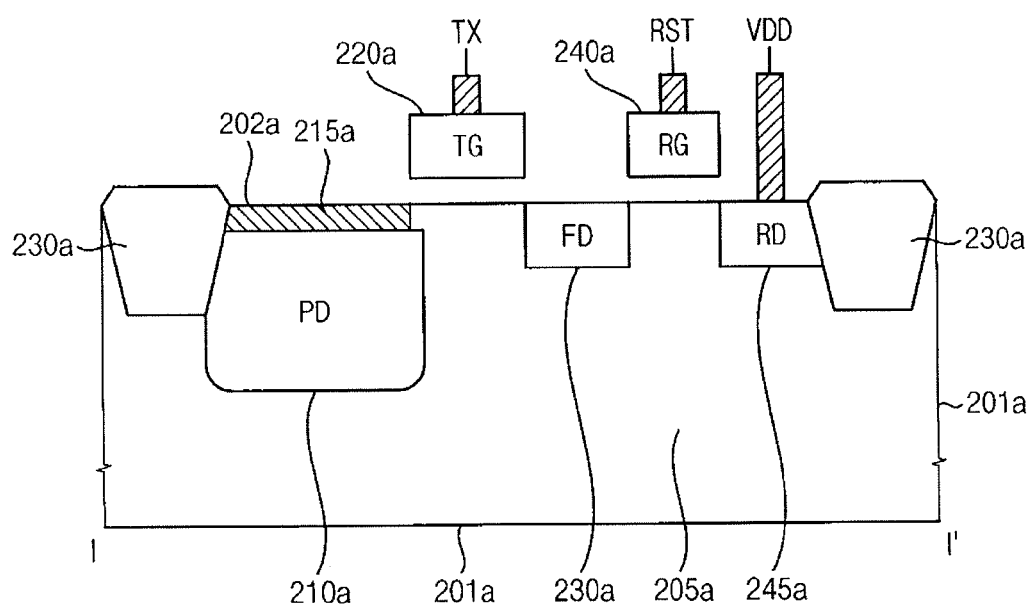
FIG. 4 illustrates the unit pixel taken along section line I-I' in FIG. 3.

FIG. 4 illustrates a view of the unit pixel 200a taken along section line I-I' of FIG. 3. Referring to FIG. 4, the photoelectric conversion region 210a may be formed within the first active region 205a defined by the isolation region 203a in the semiconductor substrate 201a. The photoelectric conversion region 210a may be doped with impurities (e.g., n-type impurities) of an opposite conductivity type to that of the semiconductor substrate 201a. The photoelectric conversion region 210a may be formed by laminating a plurality of doped regions.

The semiconductor substrate 201a may include a bulk substrate and an epitaxial layer formed over the bulk substrate. For example, the epitaxial layer may be doped with p-type impurities such that doping density of the epitaxial layer may gradually decrease in a direction to a surface where gates 220a and 240a are overlain.

In at least one example embodiment, isolation region 203a may be formed among the plurality of unit pixels. The isolation region may be formed using a field oxide (FOX) by a shallow trench isolation (STI) process or a local oxidation of silicon (LOCOS) process.

The floating diffusion region 230a may be formed in the semiconductor substrate 201a by the ion implantation process. The contact 235a may be formed on the floating diffusion region 230a for electrically connecting the floating diffusion region 230a and the output unit 270a in FIG. 3.

The transfer gate 220a may be formed over the semiconductor substrate 201a, and may be disposed between the photoelectric conversion region 210a and the floating diffusion region 230a. A contact may be formed on the transfer gate 220a for receiving the transfer control signal TX. The reset gate 240a may be formed over the semiconductor substrate 201a, and may be disposed between the floating diffusion region 230a and the reset drain 245a. A contact may be formed on the reset gate 240a for receiving the reset signal RST, and a contact may be formed on the reset drain 245a for receiving the power supply voltage VDD. Although not illustrated in FIG. 5, an insulation layer including the gates 220a and 240a and the contacts may be formed over the semiconductor substrate 201a.

Figure 5:
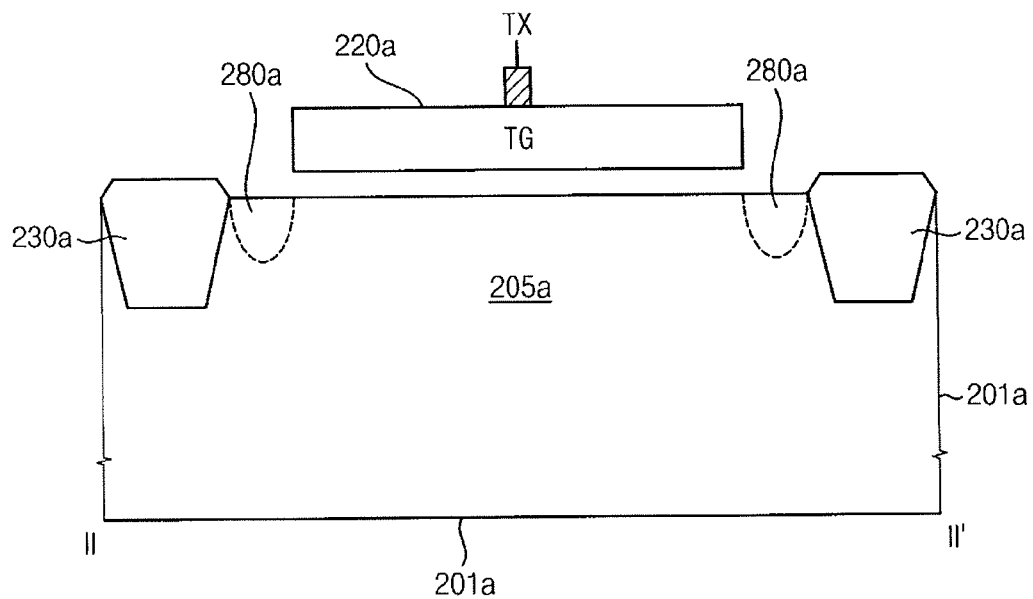
FIG. 5 illustrates the unit pixel taken along section line II-II' in FIG. 3.

FIG. 5 illustrates a view of an example of the unit pixel 200a taken along section line II-II' of FIG. 3. Referring to FIG. 5, the transfer gate 220a may be formed such that the transfer gate 220a does not overlap the isolation region 230a in the longitudinal direction. Ground voltage is applied to the active region 205a in the semiconductor substrate 201a. The transfer control signal TX with positive voltage level or negative voltage level is applied to the transfer gate 220a according to operation mode. When the transfer control signal TX with positive voltage level or negative voltage level is applied to the transfer gate 220a, an electric filed may be focused on a region 280a adjacent to the isolation region 230a. When the transfer gate 220a is formed such that the transfer gate 220a does not overlap the isolation region 230a in the longitudinal direction as in FIG. 5, influence of the electric field on the region 280a may be minimized.

In one-type of unit pixel that has been proposed, the transfer gate 220a is formed to overlap the isolation region 280a. In this case, when the transfer control signal TX with positive voltage level or negative voltage level is applied to the transfer gate 220a, intensity of the electric field is very high at the region 280a where the isolation region 280a and the transfer gate 220a overlap each other. When the intensity of the electric field at the region 280a increases, noisy electrons may be generated in the photoelectric conversion region 210a in addition to the electric charges due to the incident light, and thus dark characteristic of the unit pixel 200a may be degraded. However, according to one or more embodiments described herein, the transfer gate 220a is formed such that the transfer gate 220a does not overlap the isolation region 230a. As a result, the intensity of the electric filed is reduced or minimized at the region 280a. Therefore, the dark characteristic of the unit pixel 200a may be enhanced.

In FIG. 5, first and second portions of the transfer gate 220a do not overlap the isolation region 230a in the longitudinal direction. In other example embodiments, at least one of the first and second portions of the transfer gate 220a may not overlap the isolation region 230a in the longitudinal direction.

Figure 6:
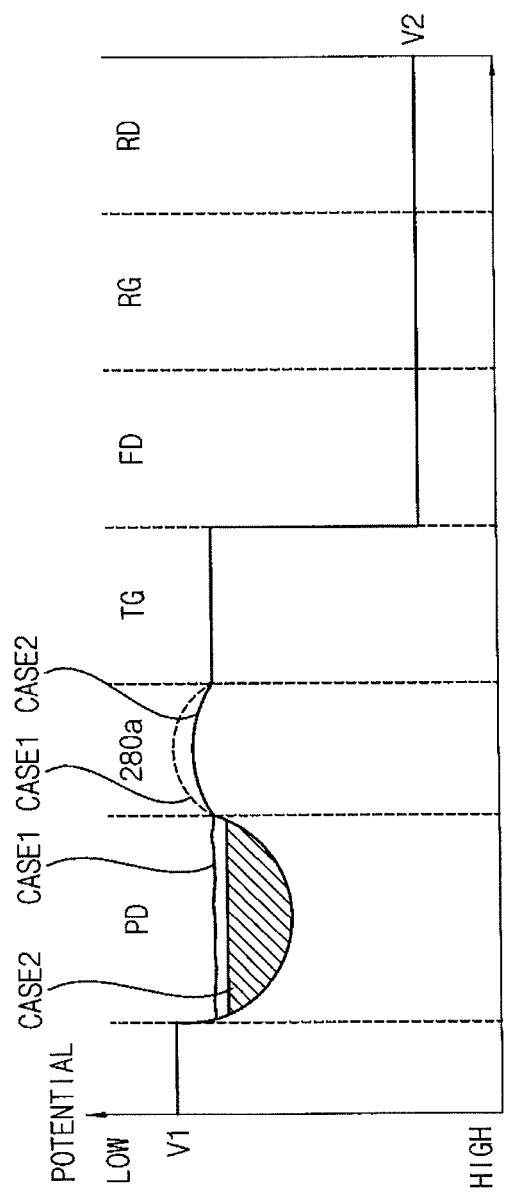
FIG. 6 illustrates an example of a potential level of the unit pixel in FIG. 3 during integration mode.

FIG. 6 illustrates an example of a potential level of the unit pixel in FIG. 3 during the integration mode. In FIG. 6, a positive direction of Y-axis corresponds to a direction where a potential level becomes lower and an electron has higher energy. For example, a level of a voltage V1 may correspond to a negative voltage level lower than a ground voltage level. A level of a voltage V2 may correspond to a power supply voltage level. In addition, first case CASE1 represents a potential level of the conventional unit pixel, and second case CASE2 represents a potential level of the unit pixel according to example embodiments.

Referring to FIG. 6, in one type of unit pixel that has been proposed, the potential level of the photoelectric conversion region 210a and the potential level of the region 280a are at lower levels because of noisy electrons generated in the photoelectric conversion region 210a, as represented by the first case CASE1. However, in a unit pixel according to one or example embodiments, the potential level of the photoelectric conversion region 210a and the potential level of the region 280a are at comparatively higher levels because the unit pixel 200a in FIG. 5 minimizes the intensity of the electric field on the region 280a, which suppresses the generation of the noisy electrons.

Figure 7:
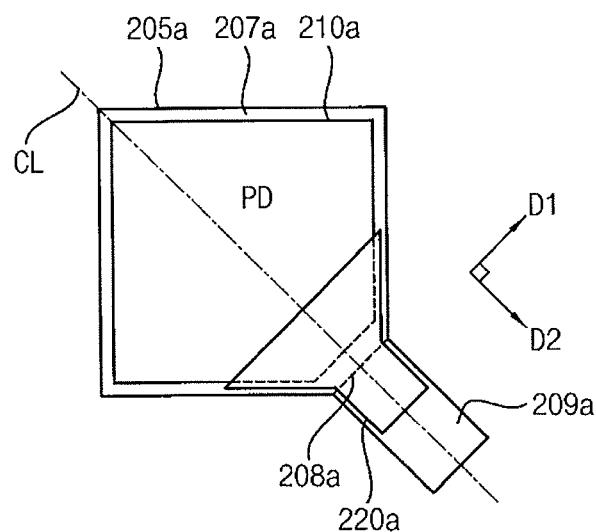
FIG. 7 illustrates an embodiment of a relationship between the transfer gate and the active region in the unit pixel.

FIG. 7 illustrates an embodiment of a relationship between the transfer gate and the active region in the unit pixel. Referring to FIG. 7, the active region 205a may include first and second sections 207a and 209a. The first section 207a may have a corner-cut foursquare or rectangular shape in plan view. The corner-cut edge of the first section 207a may extend to a first direction D1 along with a longitudinal direction. The second section 209a may have a rectangular shape projecting to a second direction D2 perpendicular to the first direction D1 from the corner-cut edge of the first section 207a.

The photoelectric conversion region 201a may be formed in the first section 207a such that the photoelectric conversion region 201a has a similar shape with the first section 207a. The floating diffusion region 220a is formed in the second section 209a. The transfer gate 220a may include first and second portions divided by a central line CL in the second direction. The central line CL is a virtual line that divides the first and second sections 207a and 209a equally in the second direction D2. The transfer gate 220a is symmetric with respect to the central line CL, and the first and second portions of the transfer gate 220a do not overlap the isolation region 230a.

Figure 8:
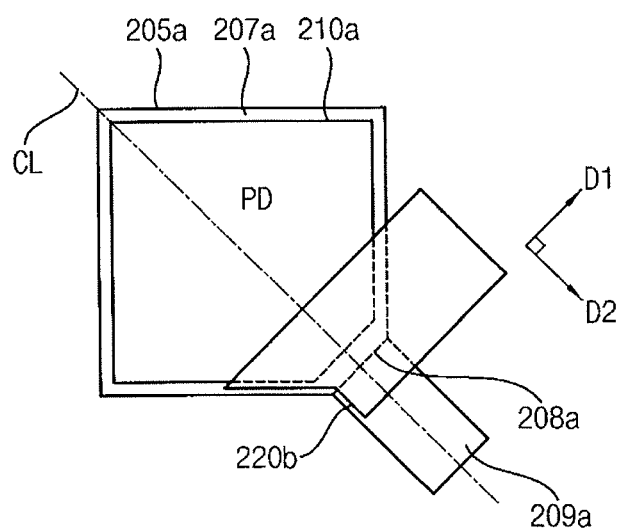
FIG. 8 illustrates another embodiment of a relationship between the transfer gate and the active region in the unit pixel.
Figure 9:
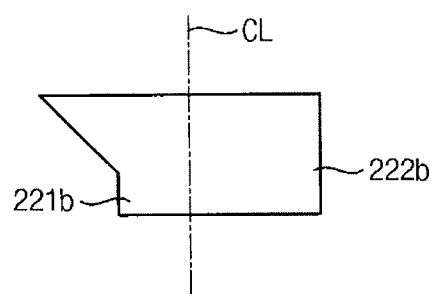
FIG. 9 illustrates an example of a shape of the transfer gate in FIG. 8.

FIG. 8 illustrates another embodiment of a relationship between the transfer gate and the active region in the unit pixel, and FIG. 9 illustrates an example of a shape of the transfer gate in FIG. 8. Referring to FIGS. 8 and 9, a transfer gate 220b is asymmetrical with respect to the central line CL. The transfer gate 220b includes first and second portions 221b and the 222b divided by the central line CL, and the second portion 222b partially overlaps the isolation region 230a.

Figure 10:
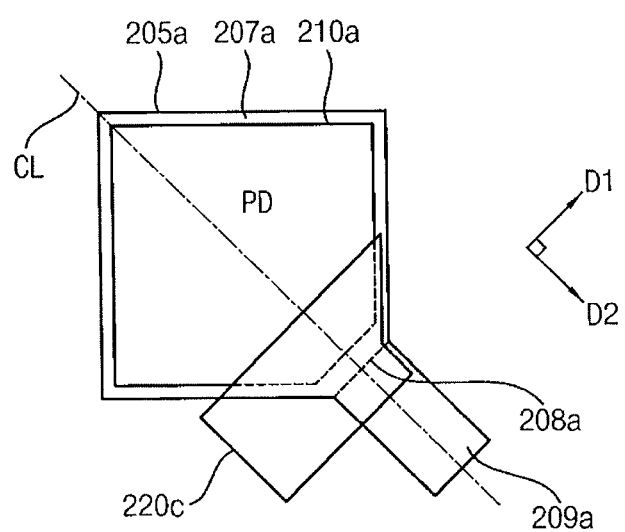
FIG. 10 illustrates another embodiment of a relationship between the transfer gate and the active region in the unit pixel.
Figure 11:
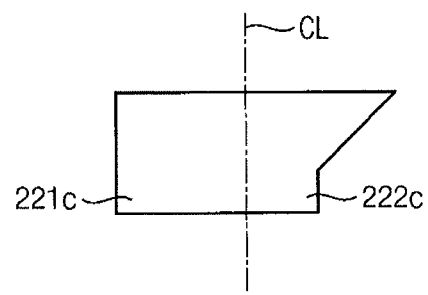
FIG. 11 illustrates an example of a shape of the transfer gate in FIG. 10.

FIG. 10 illustrates another embodiment of a relationship between the transfer gate and the active region in the unit pixel, and FIG. 11 illustrates an example of a shape of the transfer gate in FIG. 10. Referring to FIGS. 10 and 11, the transfer gate 220c is formed such that the transfer gate 220c is asymmetrical with respect to the central line CL. The transfer gate 220c includes first and second portions 221c and the 222c divided by the central line CL, and the first portion 221c partially overlaps the isolation region 230a.

Figure 12:
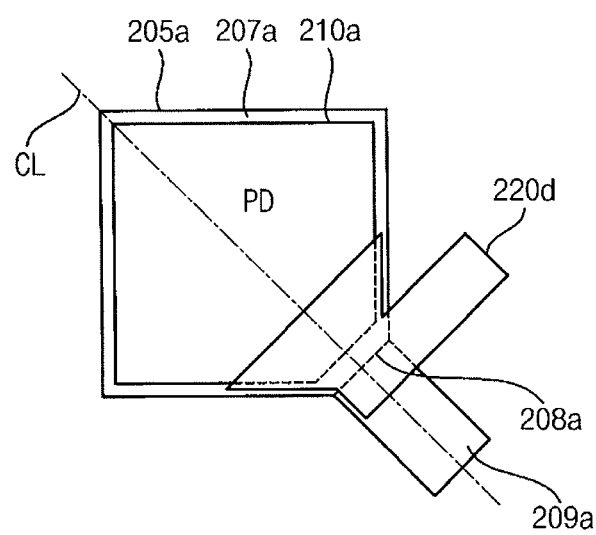
FIGS. 12 and 13 illustrate other embodiments of a relationship between the transfer gate and the active region in the unit pixel.
Figure 13:
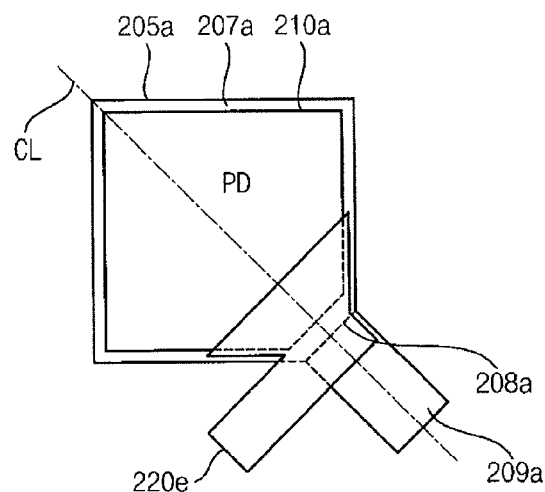

FIGS. 12 and 13 illustrate additional embodiments of a relationship between the transfer gate and the active region in the unit pixel. Referring to FIGS. 12 and 13, transfer gates 220d and 220e are asymmetrical with respect to the central line CL. A second portion of the transfer gate 220d partially overlaps the isolation region 230a, and a first portion of the transfer gate 220e partially overlaps the isolation region 230a.

Figure 14:
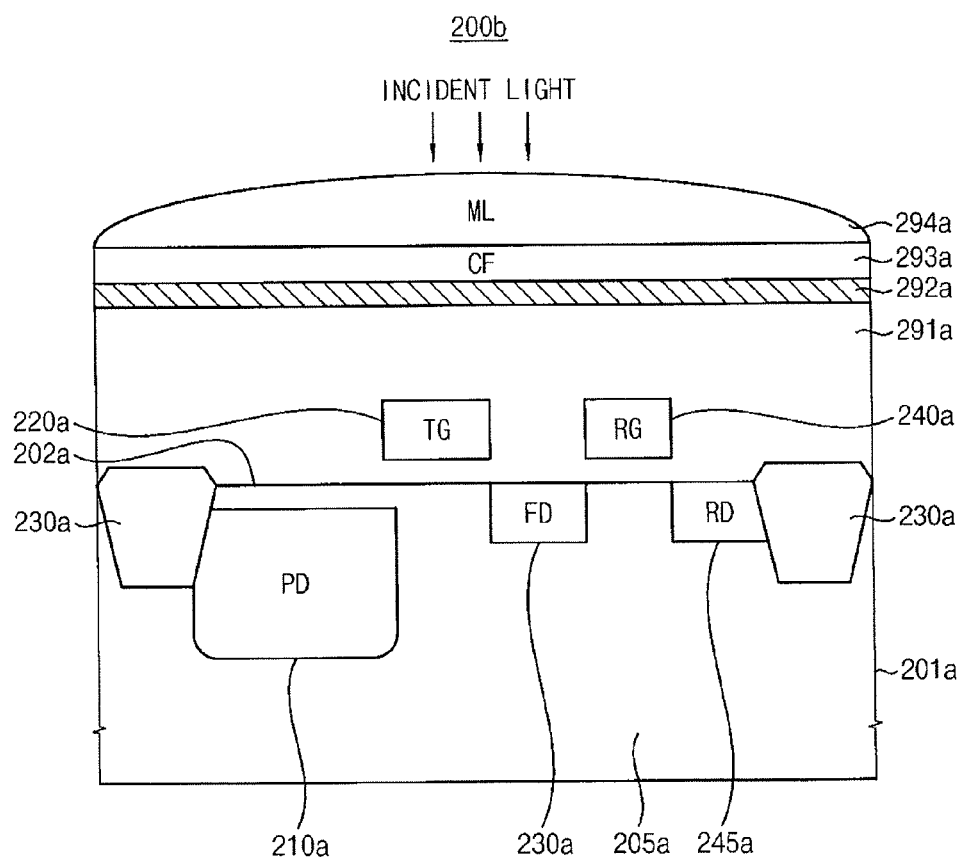
FIG. 14 illustrates another embodiment of a unit pixel.

FIG. 14 illustrates a cross-sectional view of an embodiment of a unit pixel 200b. The unit pixel 200b of FIG. 14 may be included in a front-side illuminated image sensor, and may further include a color filter and a micro lens.

Referring to FIGS. 4 and 14, the transfer gate 220a and the reset gate 240a are formed on a first surface (or a front-side) 202a of the semiconductor substrate 201a. The unit pixel 200b may further include at least one interlayer dielectric layer 291a for covering the transfer gate 220a and the reset gate 240a, which is formed over the semiconductor substrate 201a, a planarized layer 292a formed on the interlayer dielectric layer 291a, a color filter 293a formed on the planarized layer 292a, and a micro lens 294a formed on the color filter 293a.

Conductive lines, contacts, and vias may be formed in the interlayer dielectric layer 291a for electrical routing and/or blocking functions. The color filter 293a may be formed on the planarized layer 292a such that the color filter 293a corresponds to the photoelectric conversion region 210a. The color filter 293a may be included in a color filter array that includes a plurality of color filters disposed in the matrix pattern. In some embodiments, the color filter array may include a Bayer filter including red filters, green filters, and/or blue filters. Thus, the color filter 293a may be one of the red, green, and blue filters. In some embodiments, the color filter array may include yellow filters, magenta filters, and/or cyan filters, i.e., the color filter 293a may be one of the yellow, magenta, and cyan filters. The color filter array may further include a white filter.

The micro lens 294a may be formed on the color filter 293a. The micro lens 294a may be disposed corresponding to the photoelectric conversion region 210a and to the color filter 293a, respectively. The micro lens 294a may adjust a path of light entering the micro lens such that the light is focused on a corresponding photoelectric conversion region. The micro lens 294a may be included in a micro lens array that includes a plurality of micro lenses disposed in the matrix pattern.

Figure 15:
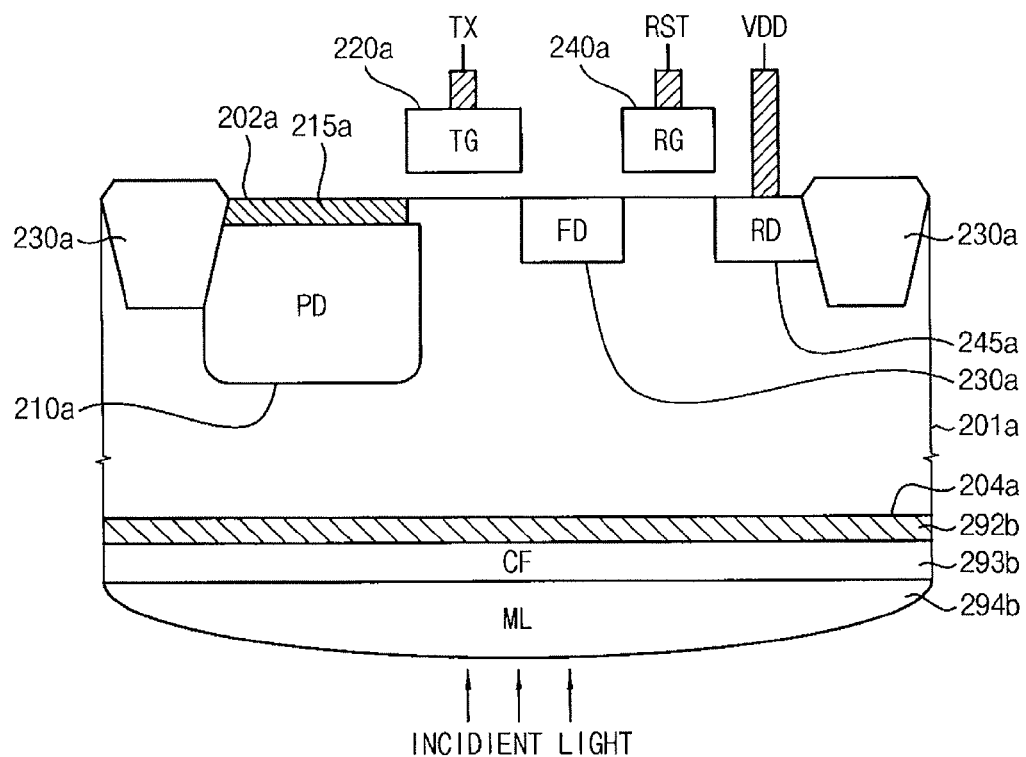
FIG. 15 illustrates another embodiment of a unit pixel.

FIG. 15 illustrates a cross-sectional view of another embodiment of a unit pixel 200c, which pixel may be included in a backside illuminated image sensor, and which may further include a color filter and a micro lens.

Referring to FIGS. 4 and 15, the transfer gate 220a and the reset gate 240a are formed on the first surface (or the front-side) 202a of the semiconductor substrate 201a. The unit pixel 200c may further include a protection layer 292b formed over a second surface (or a backside) 204a opposite to the first surface 202a, a color filter 293b and a micro lens 294b. The color filter 293b and a micro lens 294b provide the incident light to the photoelectric conversion region 210a.

In the backside illuminated image sensor, because the gate structures 220a and 240a and metal lines connected to the gate structures 220a and 240a are not disposed between the micro lens 294b and the photoelectric conversion region 210a, diffused reflection and/or scattering due to the gate structures 220a and 240a and the metal lines may not occur. Also, the distance from the micro lens 294b to the photoelectric conversion region 210a may be shorter. Accordingly, light guiding efficiency and light sensitivity may be improved in the backside illuminated image sensor.

The protection layer 292b may be formed on the second surface 204a, for example, the backside, of the semiconductor substrate 201a. The second surface 204a may correspond to the first surface 202a. The protection layer 292b may be doped with the second-type impurities with higher doping density than the semiconductor substrate 202a.

Similarly to the first impurity region 215a, the protection layer 292b may be provided to reduce the likelihood or, possibly prevent, dark currents generated adjacent to the second surface 204a of the semiconductor substrate 201a. For example, the protection layer 292b may be doped with the p-type impurities with relatively high doping density. Electric charges generated without any incident light may be coupled with the holes in the protection layer 292b. Thus, the dark currents of the image sensor including the unit pixel 200c may be reduced.

The color filter 293b may be formed on the protection layer 292b such that the color filter 293b corresponds to the photoelectric conversion region 210a. The color filter 293b may be included in a color filter array that includes a plurality of color filters disposed in the matrix pattern. In some embodiments, the color filter array may include a Bayer filter including red filters, green filters and/or blue filters. Thus, the color filter 293b may be one of the red, green and blue filters. In some embodiments, the color filter array may include yellow filters, magenta filters, and/or cyan filters, i.e., the color filter 293b may be one of the yellow, magenta, and cyan filters. The color filter array may further include a white filter.

The micro lens 294b may be formed on the color filter 293b. The micro lens 294b may be disposed corresponding to the photoelectric conversion region 210a and to the color filter 293b, respectively. The micro lens 294b may adjust a path of light entering the micro lens such that the light is focused on a corresponding photoelectric conversion region. The micro lens 294b may be included in a micro lens array that includes a plurality of micro lenses disposed in the matrix pattern.

In some embodiments, an anti-reflection layer may be provided between the protection layer 292b and the color filter 293b. The anti-reflection layer may reduce, or possibly prevent, the incident lights from being reflected by the second surface 204a of the semiconductor substrate 201a. In some embodiments, the anti-reflective layer may be formed by alternately laminating materials having different refractive indices. A higher light transmittance of the anti-reflective layer may be achieved with increased lamination of such materials.

Figure 16:
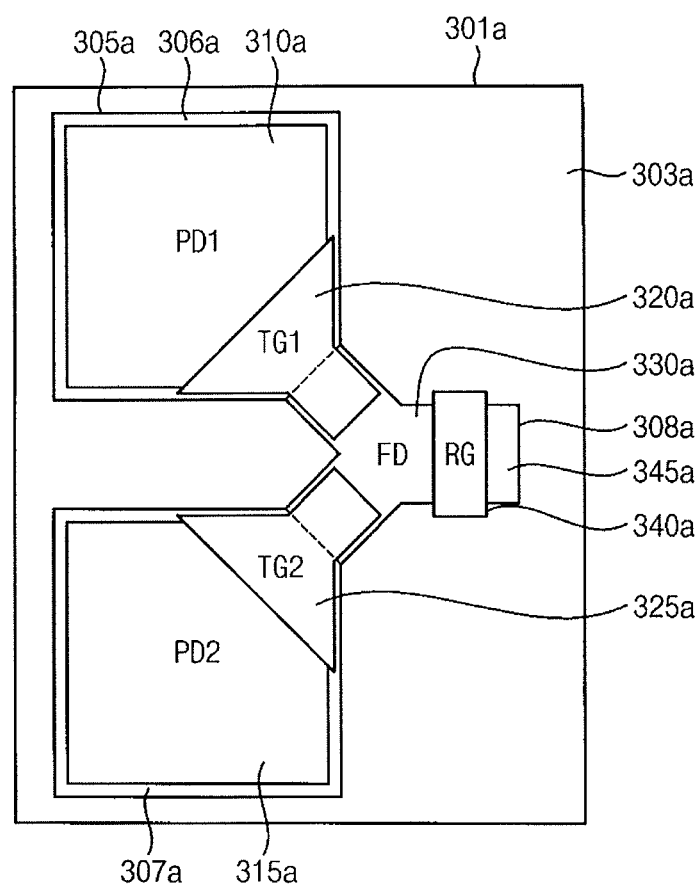
FIG. 16 illustrates another embodiment of a unit pixel in an image sensor.

FIG. 16 illustrates another embodiment of a unit pixel 300a included in a CMOS image sensor. Referring to FIG. 16, a unit pixel 300a may include a floating diffusion region 330a, a plurality of photoelectric conversion regions 310a and 315a and a plurality of transfer gates 320a and 325a. The floating diffusion region 330a may be formed in an active region 305a defined by isolation region 303a in a semiconductor substrate 301a. The photoelectric conversion regions 310a and 315a may be formed to share the floating diffusion region 330a. The transfer gates 320a and 325a are for transfer electric charges to the floating diffusion region 330a.

The active region 305a may include first through third sections 306a, 307a, and 308a. Each of the first and second sections 306a and 307a may have has a corner-cut foursquare or rectangular shape in plan view. The third section 308a has a shape in which a first projecting portion from the corner-cut edge of the first section 306a partially overlaps a second projecting portion from the corner-cut edge of the second section 307a as similarly in FIG. 7. The first photoelectric conversion region 310a is formed in the first section 306a, and the second photoelectric conversion region 315a is formed in the second section 307a. The floating diffusion region 330a and a reset drain 345a are formed in the third section 308a.

The first transfer gate 320a is formed adjacent the first photoelectric conversion region 310a and the floating diffusion region 330a. First and second portions of the first transfer gate 320a in a longitudinal direction do not overlap the isolation region 303a. The second transfer gate 325a is formed adjacent to the second photoelectric conversion region 315a and the floating diffusion region 330a. First and second portions of the second transfer gate 325a in a longitudinal direction do not overlap the isolation region 303a.

The reset gate 340a may be formed between the floating diffusion region 330a and the reset drain 345a. In some embodiments, one of the first and second portions of each of the first and second transfer gates 320a and 325a may partially overlap the isolation region 303a. In addition, in some embodiments, two photoelectric conversion regions in a column direction may be formed to share the floating diffusion region 330a.

Figure 17:
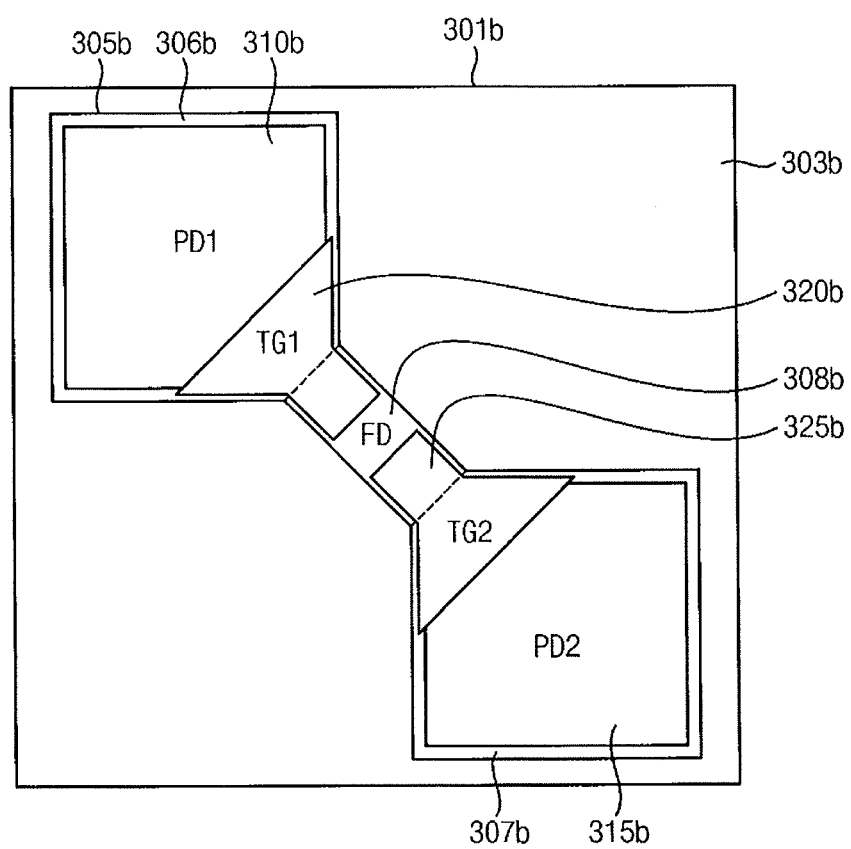
FIG. 17 illustrates another example of a unit pixel in an image sensor.

FIG. 17 illustrates another embodiment of a unit pixel 300b included in a CMOS image sensor. Referring to FIG. 17, a unit pixel 300b may include a floating diffusion region FD, a plurality of photoelectric conversion regions 310b and 315b, and a plurality of transfer gates 320b and 325b. The floating diffusion region FD may be formed in an active region 305b defined by isolation region 303b in a semiconductor substrate 301b. The photoelectric conversion regions 310b and 315b may be formed to share the floating diffusion region FD. The transfer gates 320b and 325b are provided for transferring electric charges to the floating diffusion region FD.

The active region 305b may include first through third sections 306b, 307b and 308b. Each of the first and second sections 306b and 307b may have has a corner-cut foursquare or rectangular shape in plan view. The third section 308b has a shape in which a first projecting portion from the corner-cut edge of the first section 306a overlaps a second projecting portion from the corner-cut edge of the second section 307b as similarly in FIG. 7. The first photoelectric conversion region 310b is formed in the first section 306b, and the second photoelectric conversion region 315b is formed in the second section 307b. The floating diffusion region FD is formed in the third section 308b.

The first transfer gate 320b is formed adjacent to the first photoelectric conversion region 310b and the floating diffusion region FD. First and second portions of the first transfer gate 320b in a longitudinal direction do not overlap the isolation region 303b. The second transfer gate 325b is formed adjacent to the second photoelectric conversion region 315b and the floating diffusion region FD. First and second portions of the second transfer gate 325b in a longitudinal direction do not overlap the isolation region 303b.

Figure 18:
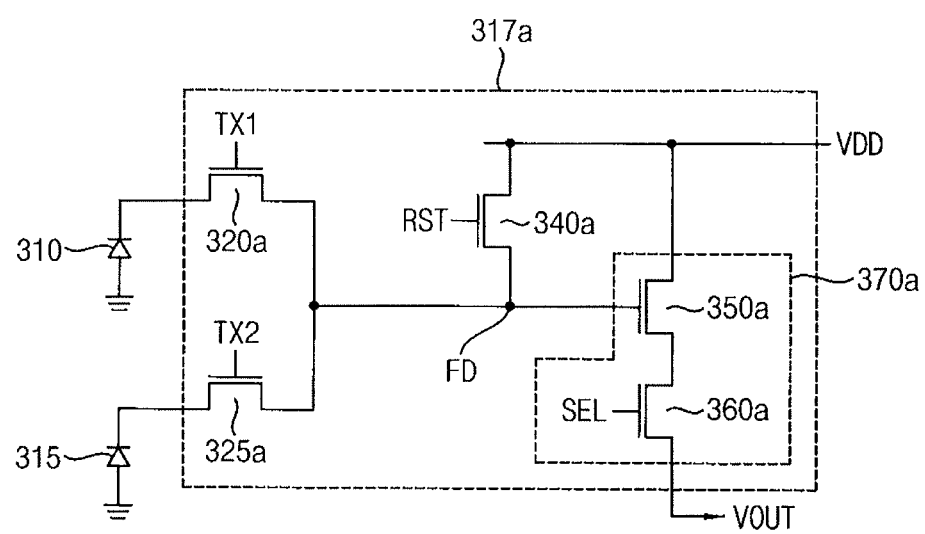
FIG. 18 illustrates an example of the unit pixel of FIG. 16.

FIG. 18 illustrates a circuit diagram illustrating an example of the unit pixel 300a of FIG. 16. Although FIG. 18 illustrates an equivalent circuit of the unit pixel 300a of FIG. 16, the unit pixel 300b of FIG. 17 may have substantially same equivalent circuit as the unit pixel 300a.

Referring to FIG. 18, the unit pixel 300a includes first and second photodiodes 310 and 315 and a signal generation unit 212. The first and second photodiodes 310 and 315 corresponding to the first and second photoelectric conversion regions 310a and 315a performs a photoelectric conversion operation. For example, the first and second photodiodes 310 and 315 may convert the incident light into the electric charges during the integration mode. The signal generation unit 317a generates an electric signal based on the electric charges generated by the photoelectric conversion operation. The signal generation unit 317a may include first and second transfer transistors 320a and 325a, a reset transistor 340a, a drive transistor 250a, a select transistor 260a, and a floating diffusion node FD. The drive transistor 250a and the select transistor 260a may be included in an output unit 370a.

A first transfer control signal TX1 is applied to a gate of the first transfer transistor 320a, and a second transfer control signal TX2 is applied to a gate of the second transfer transistor 325a. A reset signal RST is applied to a gate of the reset transistor 340a, and a power supply voltage VDD is connected to the reset transistor 340a and the drive transistor 350a. A select signal SEL is applied to a gate of the select transistor 360a, and an output signal VOUT may be provided at a source of the select transistor 360a.

Figure 19:
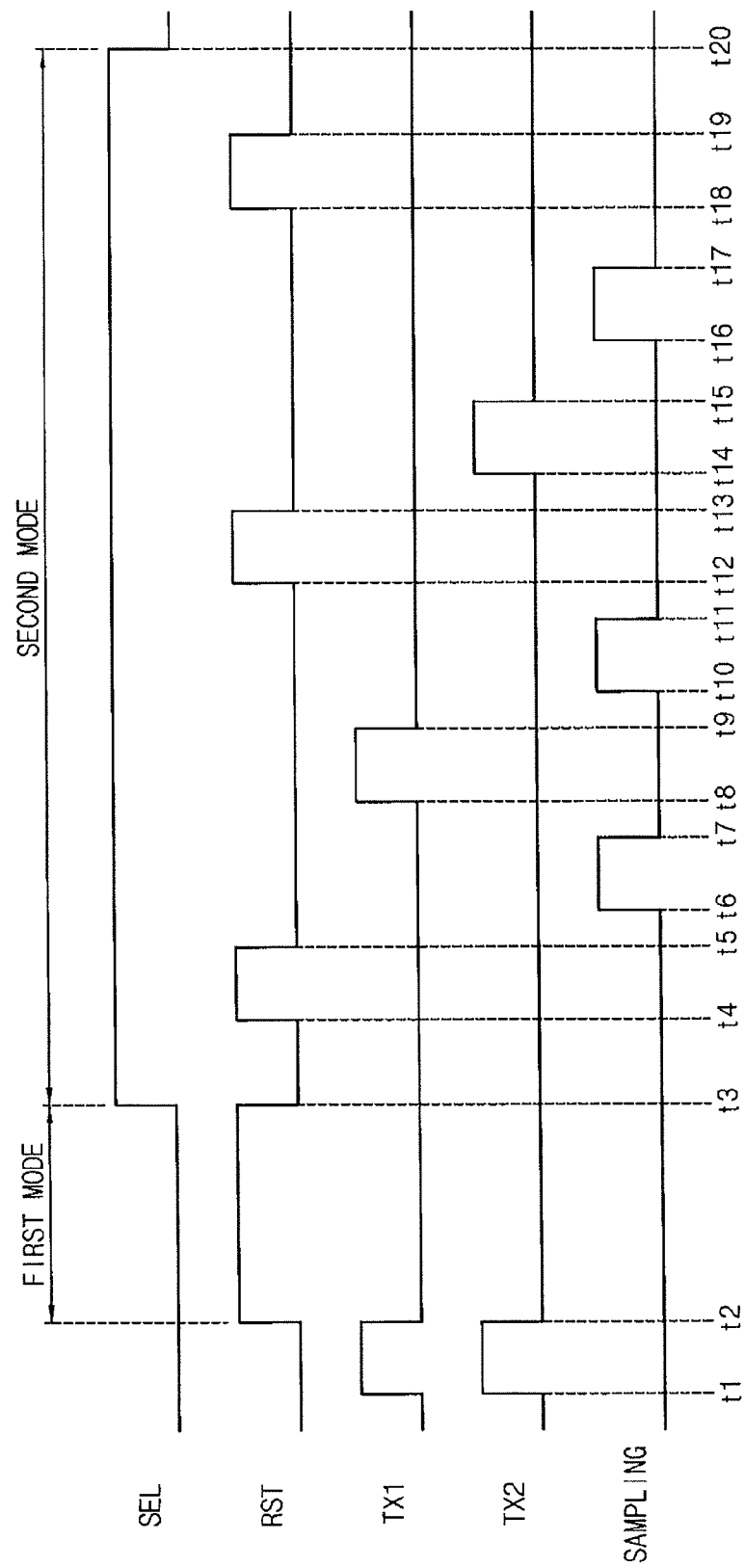
FIG. 19 illustrates a timing diagram for driving an image sensor which includes the unit pixel of FIG. 18.

FIG. 19 illustrates an example of a timing for driving operation of the CIS including the unit pixel of FIG. 18. That is, FIG. 19 illustrates a timing diagram illustrating operation of the CIS of FIG. 1 when the pixel array 111 includes unit pixels according to FIG. 18.

Referring to FIGS. 1, 16, 18 and 19, the image sensor 100 of FIG. 1 operates alternatively in two modes. During the first operation mode (i.e., the integration mode), image information on an object to be captured is obtained by collecting charge carriers in the photoelectric conversion regions 310a and 315a. During the second operation mode (i.e., the readout mode), the image information in a form of charge carriers is converted into electrical signals.

During a time period from time t1 to time t2, the first and second transfer control signals TX1 and TX2 are activated.

At time t2, the first and second transfer control signals TX1 and TX2 are deactivated, the shutter of the CMOS image sensor 100 is opened, and the CMOS image sensor 100 starts to operate in the first operation mode. During the first operation mode, the incident light is converted into electric charges in the photoelectric conversion regions 310a and 315a. The reset signal RST is activated during first operation mode to reset the floating diffusion region FD.

At time t3, the select signal SEL is activated and the unit pixel for providing the image signal is selected. The CMOS image sensor 100 starts to operate in the second operation mode.

During a time period from time t4 to time t5, the reset signal RST is activated again, the floating diffusion region FD is reset to the power supply voltage VDD level, and a noise level of the floating diffusion region FD is sampled as the output signal VOUT, i.e., a reference signal during time period from time t6 to time t7.

During a time period from time t8 to time t9, the first transfer control signal TX1 is activated and the electric charges accumulated in the first photoelectric conversion region 310a are transferred to the floating diffusion region FD.

During time period from time t10 to time t11, the output unit 370a generates a first output signal by sampling an electric potential of the floating diffusion region FD.

During a time period from time t12 to time t13, the reset signal RST is activated again, and the floating diffusion region FD is reset to the power supply voltage VDD level.

During a time period from time t14 to time t15, the second transfer control signal TX2 is activated and the electric charges accumulated in the second photoelectric conversion region 315a are transferred to the floating diffusion region FD.

During time period from time t16 to time t17, the output unit 370a generates a second output signal by sampling an electric potential of the floating diffusion region FD.

During a time period from time t18 to time t19, the reset signal RST is activated again, and the floating diffusion region FD is reset to the power supply voltage VDD level.

At time t20, the select signal SEL is deactivated, and thus the second operation mode is over. That is, during the readout mode, the first and second transfer control signals TX1 and TX2 having different activation intervals are applied to the first and second transfer transistors 320a and 325a.

In at least one example embodiment, the signal processing unit 120 generates the image signal based on the reference signal, the first output signal, and the second output signal during the second operation mode.

The CDS unit 122 performs the CDS operation on the reference signal and the first output signal to generate the first sampling signal, and performs the CDS operation on the reference signal and the second output signal to generate the second sampling signal. For example, the CDS unit 122 may generate the first sampling signal by subtracting the reference signal from the first sampling signal, and may generate the second sampling signal by subtracting the reference signal from the second sampling signal.

The ADC unit 123 adds the first sampling signal to the second sampling signal and converts the added signal into a digital signal to provide the image signal. The buffer unit 127 included in the ADC unit 123 may store the first sampling signal before until the second sampling signal is generated.

Figure 20:
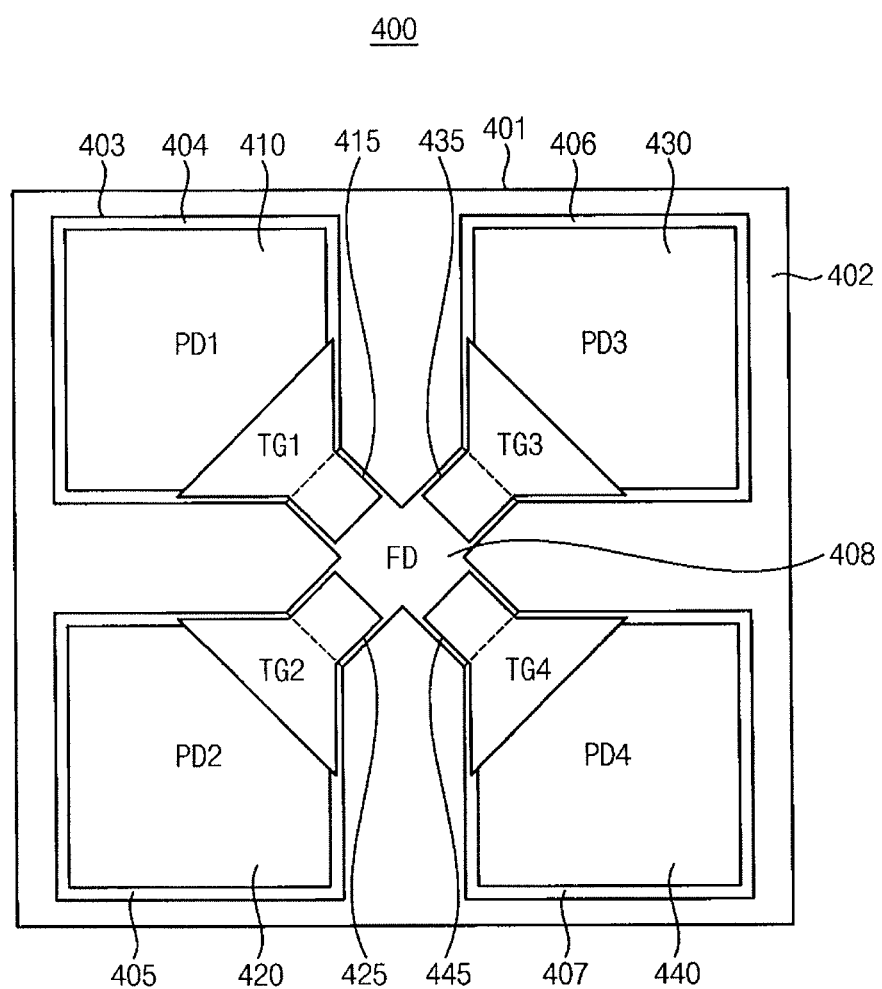
FIG. 20 illustrates an embodiment of a unit pixel in the image sensor of FIG. 1.

FIG. 20 illustrates another embodiment of a unit pixel 400 that may be included in the CMOS image sensor of FIG. 1. Referring to FIG. 20, unit pixel 400 may include a floating diffusion region FD, a plurality of photoelectric conversion regions 410, 420, 430 and 440, and a plurality of transfer gates 415, 425, 435 and 445. The floating diffusion region FD may be formed in an active region 403 defined by isolation region 402 in a semiconductor substrate 401. The photoelectric conversion regions 410, 420, 430, and 440 may be formed to share the floating diffusion region FD. The transfer gates 415, 425, 435, and 445 are for transfer electric charges to the floating diffusion region FD.

The active region 403 may include first through fifth sections 404, 405, 406, 407, and 408. Each of the first through fourth sections 404, 405, 406, and 407 may have a corner-cut foursquare or rectangular shape in plan view. The fifth section 408 has a shape that each projecting portion from the corner-cut edge of the first through fourth sections 404, 405, 406, and 407 partially overlaps each other, similarly to the embodiment in FIG. 7. The first photoelectric conversion region 410 is formed in the first section 404, the second photoelectric conversion region 420 is formed in the second section 405, the third photoelectric conversion region 430 is formed in the third section 406, and the fourth photoelectric conversion region 440 is formed in the fourth section 407. The floating diffusion region FD is formed in the fifth section 408.

The first transfer gate 415 is formed adjacent to the first photoelectric conversion region 410 and the floating diffusion region FD. First and second portions of the first transfer gate 410 in a longitudinal direction do not overlap the isolation region 402. The second transfer gate 425 is formed adjacent to the second photoelectric conversion region 420 and the floating diffusion region FD. First and second portions of the second transfer gate 425 in a longitudinal direction do not overlap the isolation region 402. The third transfer gate 435 is formed adjacent to the third photoelectric conversion region 430 and the floating diffusion region FD. First and second portions of the third transfer gate 435 in a longitudinal direction do not overlap the isolation region 402. The fourth transfer gate 445 is formed adjacent to the fourth photoelectric conversion region 440 and the floating diffusion region FD. First and second portions of the fourth transfer gate 445 in a longitudinal direction do not overlap the isolation region 402.

In some embodiments, one of the first and second portions of each of the first through transfer gates 415, 425, 435, and 445 may partially overlap the isolation region 402. The photoelectric conversion regions 410, 420, 430, and 440 are arranged in a two-by-two matrix configuration and share the floating diffusion region FD in FIG. 20.

Figure 21:
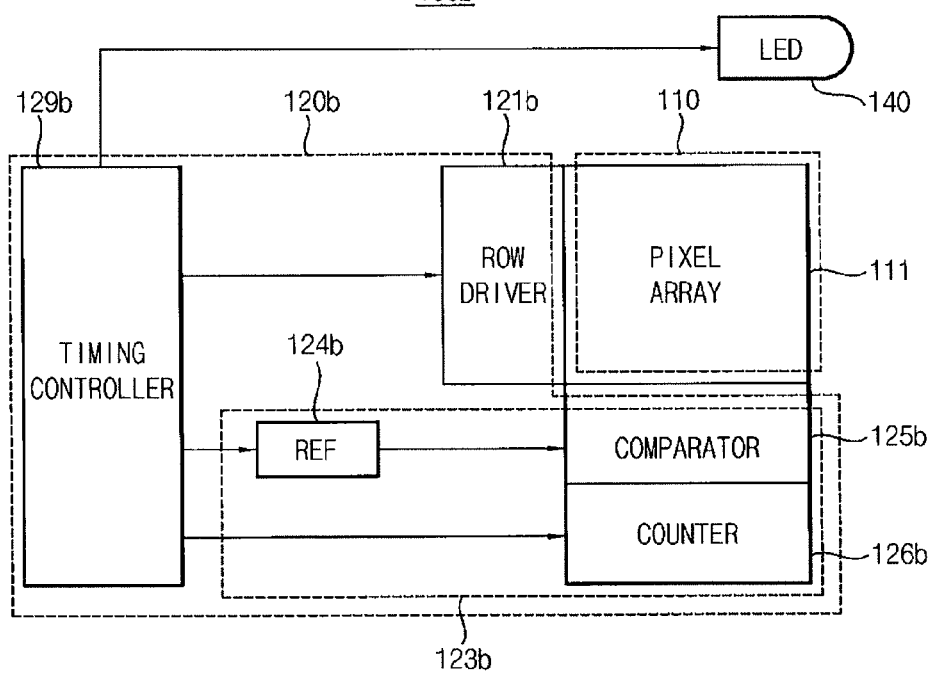
FIG. 21 illustrates an embodiment of an image sensor including unit pixels.

FIG. 21 illustrates an embodiment of an image sensor 100b including unit pixels. Referring to FIG. 21, image sensor 100b includes a photoelectric converting unit 110, a signal processing unit 120b, and a light emitting device 140. The signal processing unit 120b includes a row driver 121b, an ADC unit 123b, and a timing controller 129b. The ADC unit 123b includes a reference signal generator 124b, a comparison unit 125b, and a counter unit 126b.

In operation, analog signals detected by a pixel array 111 are converted into digital signals by the ADC unit 123b which includes a comparator 125b and the counter 126b. The analog signals are output column-by-column. Accordingly, in one embodiment, the comparator 125b and the counter 126b may include a plurality of comparators and a plurality of counters according to the column number of the pixel array 111. Using the plurality of comparators and counters coupled, the image sensor 100b may simultaneously process a plurality of pixel signals corresponding to one row, to thereby enhance operation speed and to reduce noise.

The pixel array 111 includes a plurality of unit pixels, the each of which may employ one of the unit pixels of FIGS. 13 through 18 and FIG. 20. Therefore, in each of the unit pixels in the pixel array 111, at least one of the first and second portions of the transfer gate in a longitudinal direction does not overlap the isolation region, to thereby suppress generation of noisy electrons and to enhance dark characteristic.

Figure 22:
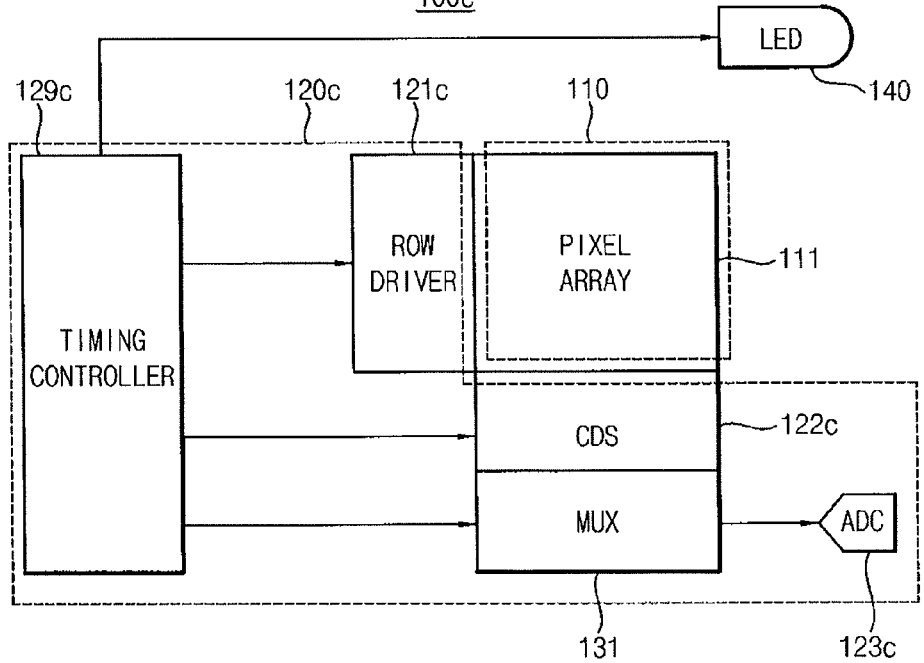
FIG. 22 illustrates another embodiment of an image sensor including unit pixels.

FIG. 22 illustrates another embodiment of an image sensor 100c including unit pixels. Referring to FIG. 22, image sensor 100c includes a photoelectric converting unit 110, a signal processing unit 120c, and a light emitting device 140. The signal processing unit 120c includes a row driver 121c, a CDS unit 122c, a multiplexer 131, an ADC 123c, and a timing controller 129c.

The CDS unit 122c may perform analog double sampling (ADS) by obtaining a difference between an analog reset signal corresponding to a reset component and an analog data signal corresponding to a measured signal component. The ADS may output an analog signal corresponding to an effective signal component column by column. The multiplexer 131 may output analog signals transmitted through column lines one after another. The ADC 123c may generate image and/or depth data by converting each analog signal into a digital signal.

The pixel array 111 includes a plurality of unit pixels, each of which may employ one of the unit pixels of FIGS. 13 through 18 and FIG. 20. Therefore, in each of the unit pixels in the pixel array 111, at least one of the first and second portions of the transfer gate in a longitudinal direction does not overlap the isolation region, to thereby suppress generation of noisy electrons and to enhance dark characteristic.

Figure 23:
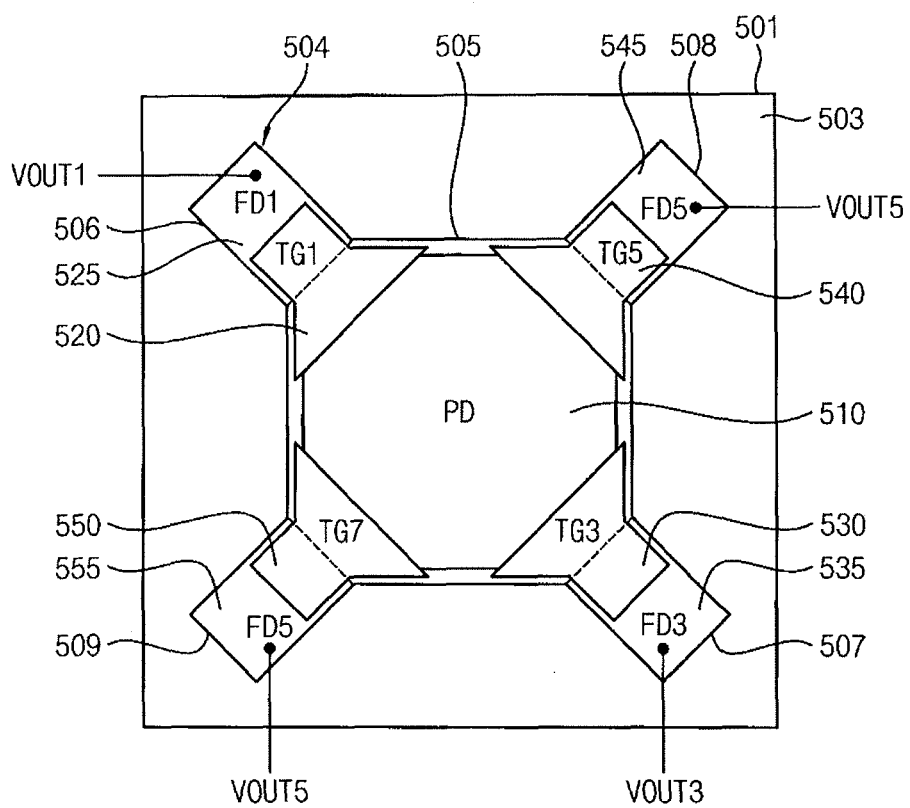
FIG. 23 illustrates an embodiment of a unit pixel in the image sensor.
Figure 24:
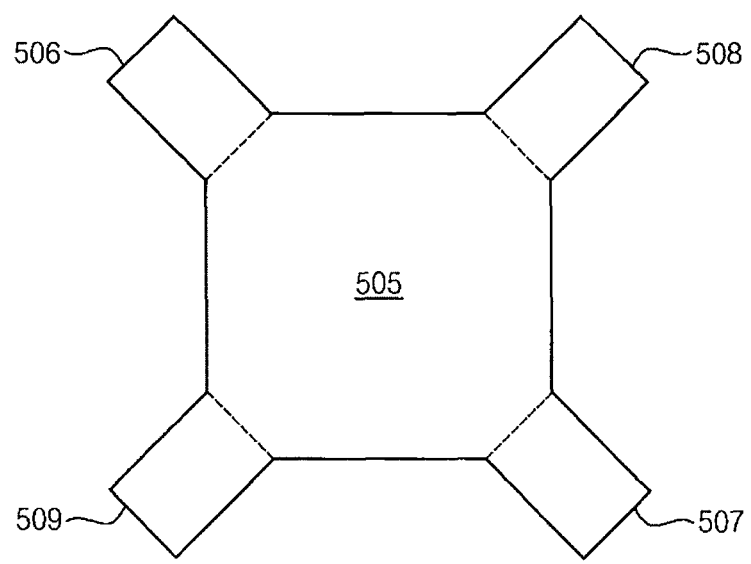
FIG. 24 illustrates an example of a unit pixel in FIG. 23.

FIG. 23 illustrates another embodiment of a unit pixel 500 that may be included in a CMOS image sensor, and FIG. 24 illustrates a plan view of the unit pixel in FIG. 23. Referring to FIGS. 23 and 24, a unit pixel 500 may include a photoelectric conversion region 510, a plurality of floating diffusion regions 525, 535, 545, and 555, and a plurality of transfer gates 520, 530, 540 and 550. The photoelectric conversion region 510 may be formed in an active region 504 defined by isolation region 503 in a semiconductor substrate 501. The floating diffusion regions 525, 535, 545, and 555 may be formed to share the photoelectric conversion region 510. The transfer gates 520, 530, 540, and 550 are for transfer electric charges to the floating diffusion regions 525, 535, 545, and 555.

The active region 504 may include first through fifth sections 505, 506, 507, 508, and 509. The first section 505 has an eight-sided shape in which four corners of a square are cut in a plan view. Each of the second through fifth sections 506, 507, 508, and 509 may have a foursquare or rectangular shape projecting from each corner-cut edge of the first section 505 in plan view. The first floating diffusion region 525 is formed in the first section 506, the second floating diffusion region 535 is formed in the second section 507, the third floating diffusion region 545 is formed in the third section 508, and the fourth floating diffusion region 555 is formed in the fourth section 509.

The first transfer gate 520 is formed adjacent to the photoelectric conversion region 510 and the first floating diffusion region 525. First and second portions of the first transfer gate 520 in a longitudinal direction do not overlap the isolation region 503. The second transfer gate 530 is formed adjacent to the photoelectric conversion region 510 and the second floating diffusion region 535. First and second portions of the second transfer gate 530 in a longitudinal direction do not overlap the isolation region 503. The third transfer gate 540 is formed adjacent to the photoelectric conversion region 510 and the third floating diffusion region 545. First and second portions of the third transfer gate 540 in a longitudinal direction do not overlap the isolation region 503. The fourth transfer gate 550 is formed adjacent to the photoelectric conversion region 510 and the fourth floating diffusion region 555. First and second portions of the fourth transfer gate 550 in a longitudinal direction do not overlap the isolation region 503.

In some embodiments, one of the first and second portions of each of the first through transfer gates 520, 530, 540, and 550 may partially overlap the isolation region 503. In addition, the third and fourth floating diffusion regions 545 and 555 may be connected to each other to provide a same floating diffusion node FDS.

The first and second floating diffusion regions 525 and 535 may generate at least one depth signal VOUT1 and VOUT3, which may be used to detect a distance of an object, based on first electric charges generated in the photoelectric conversion region 510 during a first operation mode. The third and fourth floating diffusion regions 545, and 555 may generate a color signal VOUT5, which may be used for detecting color of the object, based on first electric charges generated in the photoelectric conversion region 510 during a second operation mode.

Figure 25:
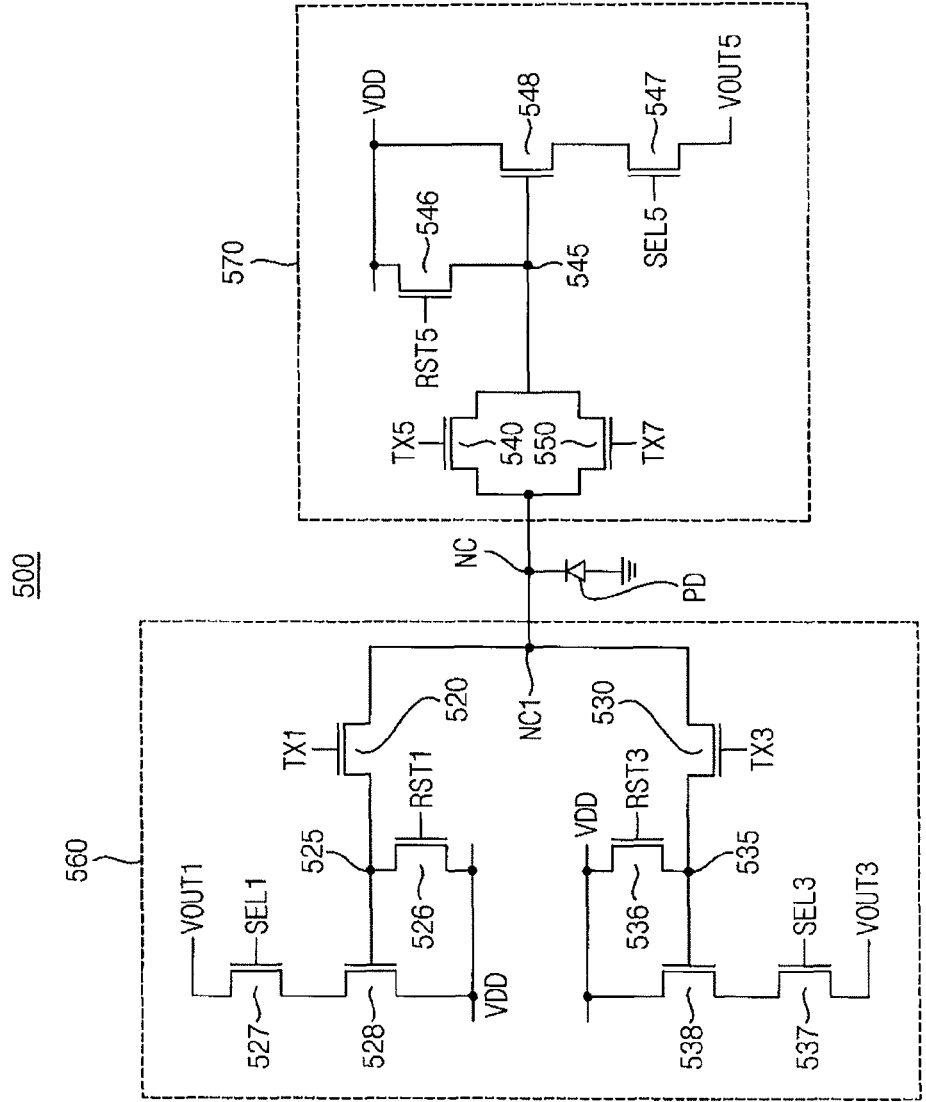
FIG. 25 illustrates an example of the unit pixel of FIG. 23.

FIG. 25 illustrates an example of a circuit diagram of the unit pixel 500 of FIG. 23. Referring to FIG. 25, the unit pixel 500 includes a photodiode PD implemented with the photoelectric conversion region 510, a depth signal generation unit 560, and a color signal generation unit 570. The depth signal generation unit 560 is connected to the color signal generation unit 570 at a connection node NC.

The depth signal generation unit 560 includes a transfer transistor 520 connected to the connection node NC, a reset transistor 526, a drive transistor 528, and a select transistor 527. The depth signal generation unit 560 further includes a transfer transistor 530 connected to the connection node NC, a reset transistor 536, a drive transistor 538, and a select transistor 537. The transfer transistor 520 is connected between the connection node NS and a floating diffusion node 525, and has a gate receiving a transfer control signal TX1. The reset transistor 526 is connected between the floating diffusion node 525 and a power supply voltage VDD, and has a gate receiving a reset signal RST1. The drive transistor 528 is connected between the power supply voltage VDD and the select transistor 527, and has a gate connected to the floating diffusion node 525.

The select transistor 527 has a first terminal connected to the drive transistor 528, a second terminal providing the depth signal VOUT1, and a gate receiving a select signal SEL1. The transfer transistor 530 is connected between the connection node NS and a floating diffusion node 535, and has a gate receiving a transfer control signal TX3. The reset transistor 536 is connected between the floating diffusion node 525 and the power supply voltage VDD, and has a gate receiving a reset signal RST3. The drive transistor 538 is connected between the power supply voltage VDD and the select transistor 537, and has a gate connected to the floating diffusion node 535.

The select transistor 537 has a first terminal connected to the drive transistor 538, a second terminal providing the depth signal VOUT3, and a gate receiving the select signal SEL3. Therefore, the depth signal generation unit 560 may generate the at least one depth signal VOUT1 and VOUT3, which may be used for detecting the distance of the object based on first electric charges using the photodiode D1.

The color signal generation unit 570 includes transfer transistors 540 and 550, a reset transistor 546, a drive transistor 548, and a select transistor 547. The transfer transistor 540 is connected between the connection node NS and a floating diffusion node 545, and has a gate receiving a transfer control signal TX5. The transfer transistor 550 is connected between the connection node NS and the floating diffusion node 545, and has a gate receiving a transfer control signal TX7. The reset transistor 546 is connected between the floating diffusion node 545 and the power supply voltage VDD, and has a gate receiving a reset signal RST5. The drive transistor 548 is connected between the power supply voltage VDD and the select transistor 547, and has a gate connected to the floating diffusion node 545.

The select transistor 547 has a first terminal connected to the drive transistor 548, a second terminal providing the color signal VOUT5, and a gate receiving a select signal SEL5. Therefore, the color signal generation unit 570 may generate the color signal VOUT5, which may be used for detecting the distance of the object based on second electric charges using the photodiode D1.

Figure 26:
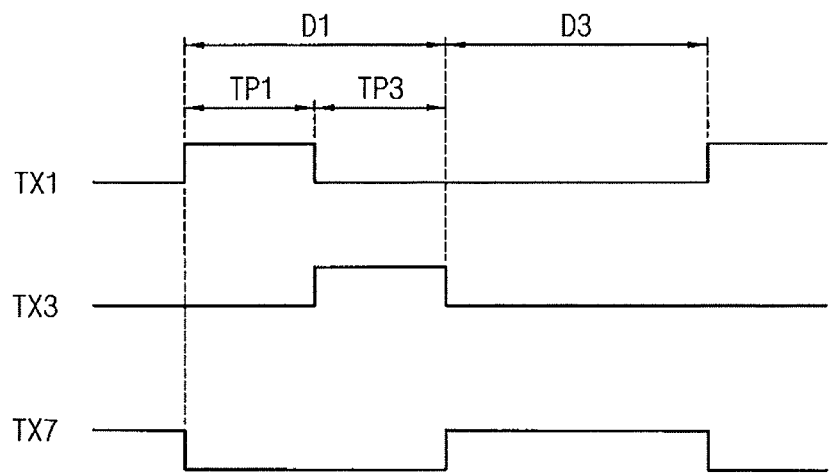
FIG. 26 illustrates a timing diagram for driving the unit pixel of FIG. 25.

FIG. 26 illustrates an example of a timing diagram for driving the unit pixel of FIG. 25. Referring to FIGS. 25 and 26, during operation of the unit pixel, the photodiode PD may generate the first electric signals by receiving transmitted light from the object during the first operation mode D1.

During a first time period TP1 of the first operation mode D1, when the transfer control signal TX1 is activated, the electric charges generated in the photodiode PD is transferred to the floating diffusion node 525, and the floating diffusion node 525 accumulates the electric charges to provide the depth signal VOUT1.

During a second time period TP2 of the first operation mode D1, when the transfer control signal TX2 is activated, the electric charges generated in the photodiode PD is transferred to the floating diffusion node 525, and the floating diffusion node 525 accumulates the electric charges to provide the depth signal VOUT3. The signal processing unit 120 in FIG. 1 may measure the distance of the object based on the depth signals VOUT1 and VOUT2 in the first operation mode D1.

During the second operation mode D2, the may generate the second electric signals by receiving light energy from the object. During the second operation mode D2, when the transfer control signals TX5 and TX7 are activated, the second electric signals are transferred to the floating diffusion node 545 and accumulated in the floating diffusion node 545. The floating diffusion node 545 may generate the color signal VOUT5 based on the accumulated second electric signals. The signal processing unit 120 in FIG. 1 may detect color of the object based on the color signal VOUT5 in the second operation mode D2.

The image sensor including the unit pixels of FIGS. 23 through 25 may allow for a reduction in pixel size and system size by generating depth signal and color signal using same photo-diode. Also, in each of the unit pixels in the pixel array, at least one of the first and second portions of the transfer gate in a longitudinal direction does not overlap the isolation region, to thereby suppress generation of noisy electrons and to enhance dark characteristic.

Figure 27:
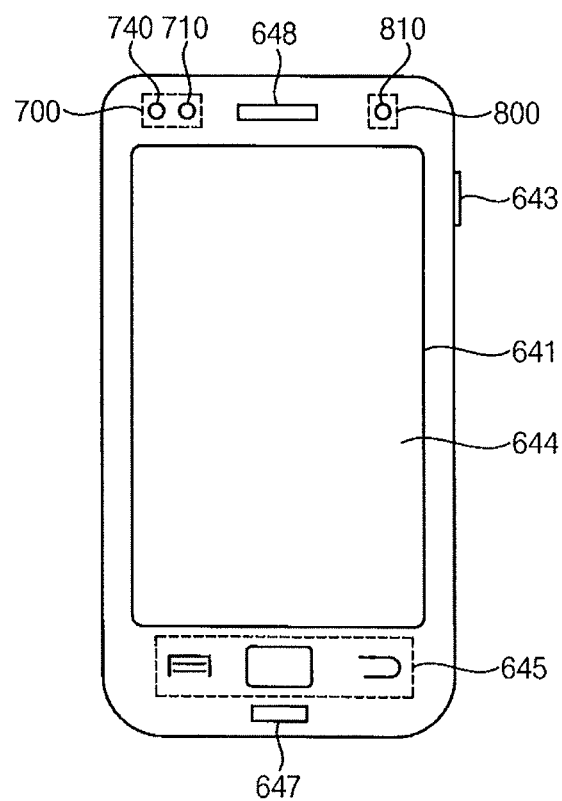
FIG. 27 illustrates an embodiment of a mobile system.

FIG. 27 illustrates an embodiment of a mobile system 600 which includes a 3D image sensor 700, a 2D image sensor 800, and a display device 641. The mobile system 600 may further include a touch screen 644, buttons 643 and 645, a microphone 647, and a speaker 648.

The 3D image sensor 700 is installed on a first surface (for instance, a front surface) of the mobile system 600. The 3D image sensor 700 performs a first sensing operation to detect the proximity of a subject and performs a second sensing operation to recognize a gesture of the subject by acquiring distance information for the subject. The 3D image sensor 700 may include a sensing unit 710 having a plurality of depth pixels and a light source unit 740 to emit infrared or near-infrared light.

The 2D image sensor 800 is installed on the first surface of the mobile system 600 and performs a third sensing operation to acquire color image information for the subject. The 2D image sensor 800 may include a second sensing unit 810 having a plurality of color pixels.

In the example embodiment of FIG. 27, the 3D image sensor 700 and the 2D image sensor 800 may be prepared as two integrated circuit chips separated from each other. That is, the mobile system 600 may include two sensing modules. In this case, the depth pixels and the color pixels may constitute two pixel arrays separated from each other.

The display device 641 is installed on the first surface of the mobile system 600 to display the results of the first sensing, the second sensing, and the third sensing.

Unit pixels of a pixel array included in the 3D image sensor 700 and the 2D image sensor 800 may employ one of the unit pixels of FIGS. 13 through 18 and FIG. 20. Therefore, in each of the unit pixels in the pixel array, at least one of the first and second portions of the transfer gate in a longitudinal direction does not overlap the isolation region, to thereby suppress generation of noisy electrons and to enhance dark characteristic.

Figure 28:
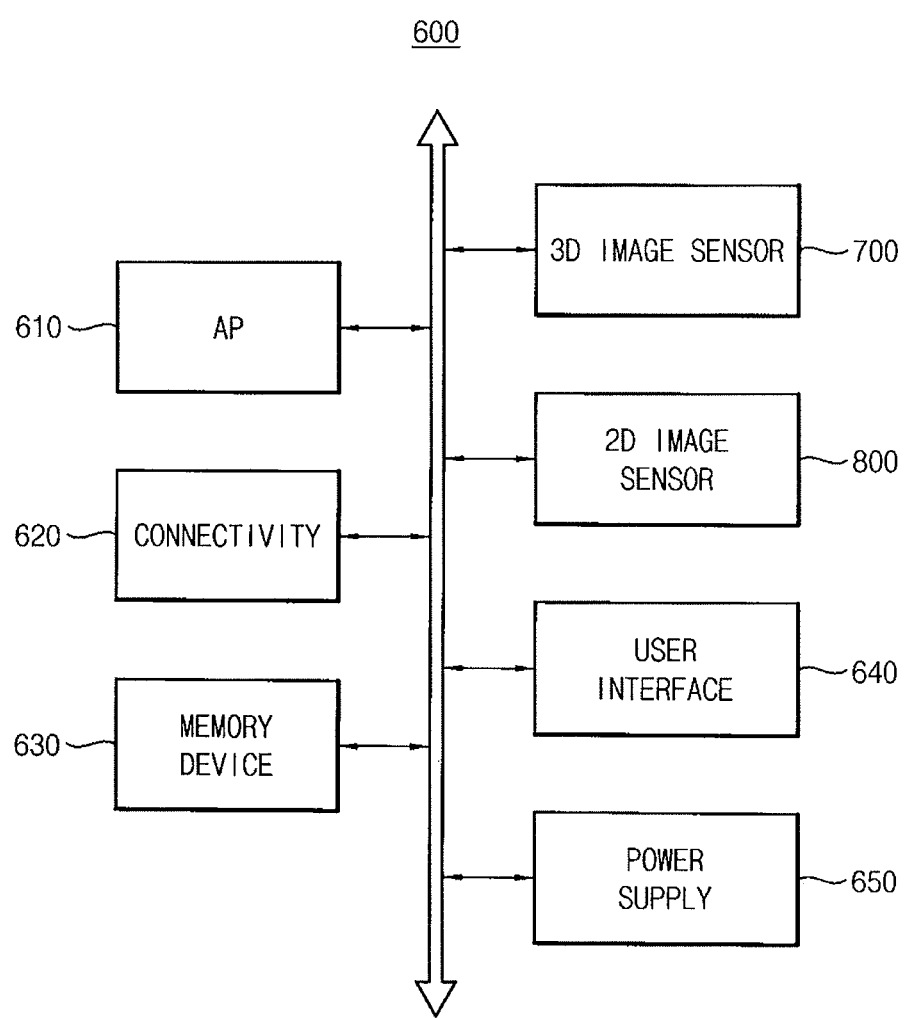
FIG. 28 illustrates an internal configuration of the mobile system in FIG. 27.

FIG. 28 illustrates an internal configuration of the mobile system shown in FIG. 27. Referring to FIG. 28, the mobile system 600 includes an application processor 610, a connectivity unit 620, a memory device 630, a 3D image sensor 700, a 2D image sensor 800, a user interface 640, and a power supply 650. According to example embodiments, the mobile system 600 may be a mobile phone, a smart phone, a tablet PC, a laptop computer, a PDA (Personal Digital Assistant), a PMP (Portable Multimedia Player), a digital camera, a music player, a portable game console, a navigation system, or another type of information terminal or electronic device.

The application processor 610 may operate based on an operating system (OS) of the mobile system 600. In addition, the application processor 610 may execute various applications to provide, for example, an internet browser, a game, and/or a dynamic image. According to example embodiments, the application processor 610 may be a single-core or multi-core processor. In addition, according to example embodiments, the application processor 610 may further include a cache memory positioned inside or outside the application processor 610.

The connectivity unit 620 may establish communications with various external devices. For instance, the connectivity unit 620 may establish the USB (Universal Serial Bus) communication, Ethernet communication, NFC (Near Field Communication), RFID (Radio Frequency Identification) communication, mobile telecommunication, or memory card communication. The connectivity unit 620 may include a baseband chipset and may support communications such as GSM, GPRS, WCDMA, and HSxPA.

The memory device 630 may store data processed by the application processor 1010 or may operate as a working memory. In addition, the memory device 630 may store a bottom image for booting the mobile system 600, a file system related to the operating system to operate the mobile system 600, a device driver related to external devices connected to the mobile system 600, and the applications executed in the mobile system 600.

The memory device 630 may be or include, for example, a volatile memory such as DRAM (Dynamic Random Access Memory), SRAM (Static Random Access Memory), mobile DRAM, DDR SDRAM, LPDDR SDRAM, GDDR SDRAM, or RDRAM. Alternatively, the memory device 630 may be or include a nonvolatile memory such as EEPROM (Electrically Erasable Programmable Read-Only Memory), Flash Memory, PRAM (Phase Change Random Access Memory), RRAM (Resistance Random Access Memory), NFGM (Nano Floating Gate Memory), PoRAM (Polymer Random Access Memory), MRAM (Magnetic Random Access Memory), or FRAM (Ferroelectric Random Access Memory).

The 3D image sensor 700 may perform the first sensing operation and the second sensing operation, and the 2D image sensor 800 may perform the third sensing operation.

The user interface 640 may include at least one input device such as a keypad, the buttons 643 and 645 or the touch screen 644, and/or at least one output device such as the speaker 648 or the display device 641. The power supply 650 may supply operating voltage to the mobile system 600.

The mobile system 600 or components of the mobile system 600 may be mounted by using various types of packages such as PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package), or WSP (Wafer-Level Processed Stack Package).

Figure 29:
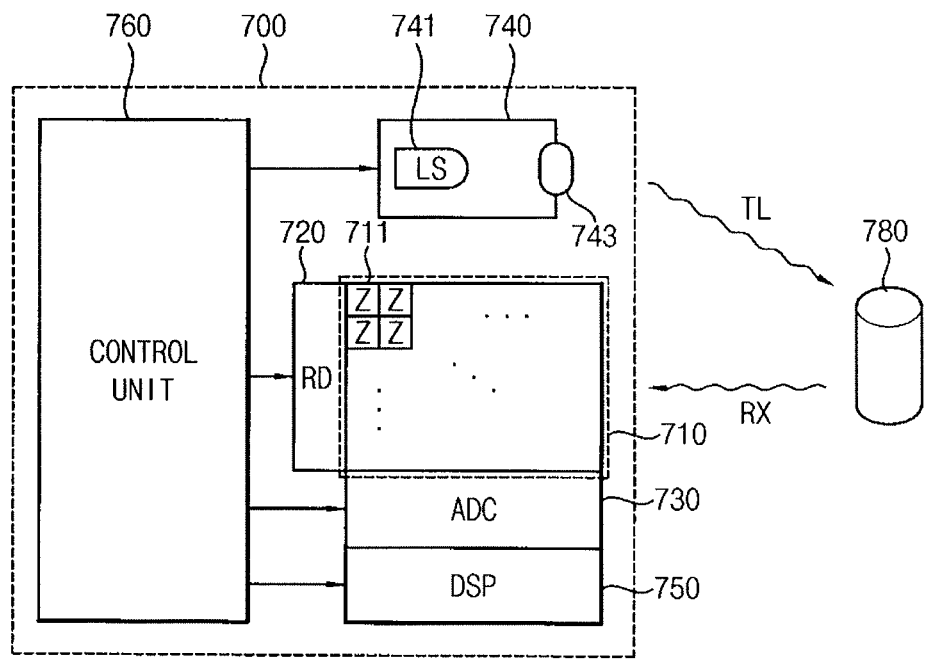
FIG. 29 illustrates an embodiment of a 3D image sensor in the mobile system.

FIG. 29 illustrates an embodiment of the 3D image sensor 700 included in the mobile system shown in FIG. 27. Referring to FIG. 29, the 3D image sensor 700 may include a sensing unit 710, an RD (row driving) unit 720, an ADC (Analog-to-Digital Converting) unit 730, a light source unit 740, a DSP (Digital Signal Processing) unit 750, and a control unit 760.

The light source unit 740 may output light TL having a predetermined wavelength (for instance, infrared or near-infrared light). The light source unit 740 may be selectively activated or may emit lights having mutually different brightness according to the operation mode.

The light source unit 740 may include a light source 741 and a lens 743. The light source 741 may generate the light TL. For instance, the light source 741 may be realized as an LED (light emitting diode) or a laser diode. In one example embodiment, the light source 741 may generate light having intensity modulated to be periodically changed. For instance, the intensity of the light TL may be modulated in the form of a pulse wave having continuous pulses, a sine wave or a cosine wave. In another example embodiment, the light source 741 may generate light having constant intensity, that is, non-modulated light. The lens 741 can concentrate the light TL emitted from the light source 741 onto a subject 780.

The sensing unit 710 receives light RX reflected from the subject 780 to convert the light RX into an electric signal. In one example embodiment, the received light RX may be generated based on infrared light or near-infrared light TL emitted from the light source unit 140. In another example embodiment, the received light RX may be generated based on infrared light or near-infrared light included in ambient light. In still another example embodiment, the received light RX may be generated based on visible light included in the ambient light. In still yet another example embodiment, the received light RX may be generated based on both infrared light or near-infrared light and visible light.

The sensing unit 710 may include a plurality of depth pixels 711. All or part of the depth pixels 711 may be activated according to the operation mode. The depth pixels 711 are aligned in the form of a pixel array and provide information about the distance between the 3D image sensor 700 and the subject 780. For instance, an infrared filter or a near-infrared filter may be formed on the depth pixels 711. In the depth pixels 711, at least one of the first and second portions of the transfer gate in a longitudinal direction is not overlapped with the isolation region, thereby to suppress generation of noisy electrons to enhance dark characteristic.

The row driving unit 720 is connected to each row of the sensing unit 710 to generate a driving signal to drive each row. For instance, the row driving unit 720 can drive the depth pixels 711, which are included in the sensing unit 710, in a unit of a row.

The ADC unit 730 is connected to each column of the sensing unit 710 to convert an analog signal output from the sensing unit 710 into a digital signal. In one example embodiment, the ADC unit 730 includes a plurality of analog-digital converters and can perform the column ADC to convert the analog signals output from each column line into the digital signals in parallel (that is, concurrently). In another example embodiment, the ADC unit 730 includes a single analog-digital converter and can perform the single ADC to sequentially convert the analog signals into the digital signals.

According to example embodiments, the ADC unit 730 may include a CDS (Correlated Double Sampling) unit to extract effective signal components. In one example embodiment, the CDS unit may perform the analog double sampling to extract the effective signal components based on difference between an analog reset signal representing a reset component and an analog data signal representing a signal component. In another example embodiment, the CDS unit may perform the digital double sampling to extract the effective signal components based on difference between two digital signals after converting the analog reset signal and the analog data signal into the two digital signals. In still another example embodiment, the CDS unit may perform the dual correlated double sampling by performing both of the analog double sampling and the digital double sampling.

The DSP unit 750 receives the digital signal output from the ADC unit 730 to perform the image data processing with respect to the digital signal. For instance, the DSP unit 750 may perform the image interpolation, color correction, white balance, gamma correction, and color conversion.

The control unit 760 may control the row driving unit 720, the ADC unit 730, the light source unit 740, and the DSP unit 750. The control unit 760 may supply control signals, such as clock signals and timing control signals, required to operate the row driving unit 720, the ADC unit 730, the light source unit 740, and the DSP unit 750. In one example embodiment, the control unit 760 may include a logic control circuit, a PLL (Phase Lock Loop) circuit, a timing control circuit, and a communication interface circuit.

Figure 30:
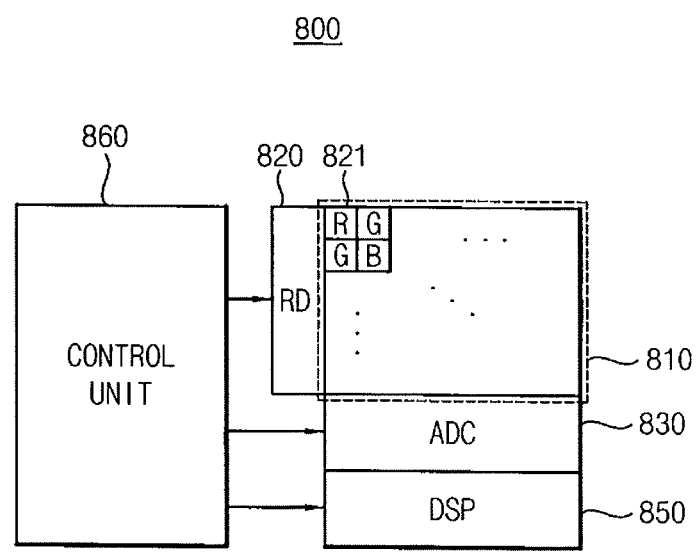
FIG. 30 illustrates an embodiment of a 2D image sensor in the mobile system.

FIG. 30 illustrates an embodiment of the 2D image sensor 800 included in the mobile system shown in FIG. 27. Referring to FIG. 30, the 2D image sensor 800 may include a sensing unit 810, a row driving unit 820, an ADC (Analog-to-Digital Converting) unit 830, a DSP (Digital Signal Processing) unit 850, and a control unit 860.

The sensing unit 810 may convert incident light (e.g., visible light) into an electric signal. The sensing unit 810 may include a plurality of color pixels 811. The color pixels 811 are aligned in the form of a pixel array and provide information about the color image for the subject. For instance, a red filter, a green filter, and a blue filter may be formed on the color pixels 811. In another example embodiment, a yellow filter, a cyan filter, and a magenta filter may be formed on the color pixels 811. In the color pixels, at least one of the first and second portions of the transfer gate in a longitudinal direction does not overlap the isolation region, thereby suppressing generation of noisy electrons and to enhance dark characteristic.

The row driving unit 820 is connected to each row of the second sensing unit 810 to generate a driving signal to drive each row. The ADC unit 830 is connected to each column of the second sensing unit 810 to convert an analog signal output from the second sensing unit 810 into a digital signal. According to example embodiments, the ADC unit 830 may include a CDS (Correlated Double Sampling) unit to extract effective signal components. The DSP unit 850 receives the digital signal output from the ADC unit 830 to perform the image data processing with respect to the digital signal. The control unit 860 may control the row driving unit 820, the ADC unit 830, and the DSP unit 850.

Figure 31:
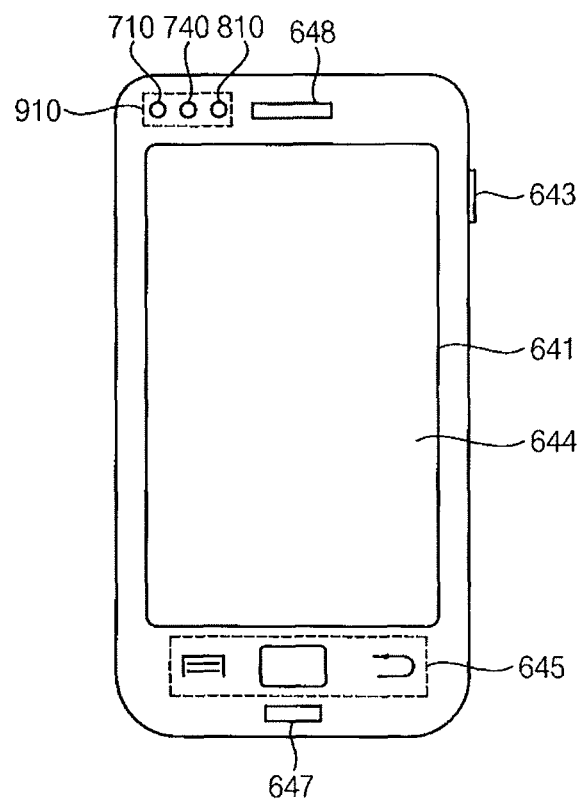
FIG. 31 illustrates another embodiment of a mobile system.

FIG. 31 illustrates another embodiment of a mobile system 900 which includes an image sensor 910 and a display device 641. The mobile system 900 may further include a touch screen 644, buttons 643 and 645, a microphone 647, and a speaker 648.

The image sensor 910 is installed on a first surface (for instance, a front surface) of the mobile system 900. The image sensor 910 performs a first sensing operation to detect proximity of a subject, a second sensing operation to recognize a gesture of the subject by acquiring distance information for the subject, and a third sensing operation to acquire color image information for the subject. The image sensor 910 may include a first sensing unit 7101 having a plurality of depth pixels, a light source unit 740 to emit infrared light or near-infrared light, and a second sensing unit 810 having a plurality of color pixels.

In the example embodiment of FIG. 31, a 3D image sensor and a 2D image sensor may be prepared as one integrated circuit chip. That is, the mobile system 900 may include one sensing module. In this case, the depth pixels and the color pixels may constitute two pixel arrays separated from each other. In the depth pixels and the color pixels, at least one of the first and second portions of the transfer gate in a longitudinal direction does not overlap the isolation region, to thereby suppress generation of noisy electrons and to enhance dark characteristic.

The display device 641 is installed on the first surface of the mobile system 900 to display the results of the first, second, and third sensing operations.

The mobile system 900 of FIG. 31 is substantially identical to the mobile system 600 of FIG. 27, except that the 3D image sensor and the 2D image sensor of the mobile system 900 are prepared as one integrated circuit chip.

Figure 32:
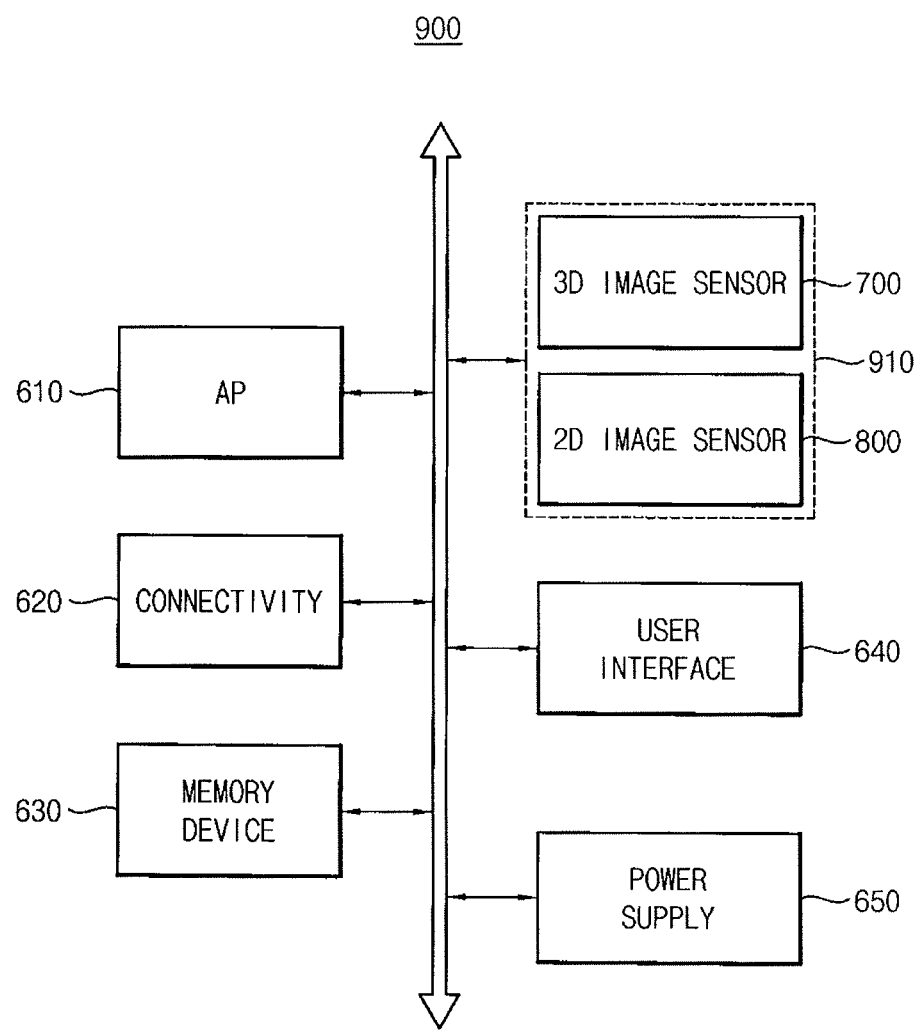
FIG. 32 illustrates an internal configuration of the mobile system in FIG. 31.

FIG. 32 illustrates an internal configuration of the mobile system 900 shown in FIG. 31. Referring to FIG. 32, mobile system 900 includes an application processor 610, a connectivity unit 620, a memory device 630, an image sensor 910, a user interface 640, and a power supply 650. When comparing with the mobile system 600 of FIG. 28, the mobile system 900 of FIG. 32 may further include the image sensor 910 where the 3D image sensor 700 and the 2D image sensor 800 are integrated.

The image sensor 910 may perform the first sensing operation, the second sensing operation, and the third sensing operation. For instance, the image sensor 910 may primarily perform the first sensing operation, and at least one of the second sensing operation and the third sensing operation may be performed based on the result of the first sensing operation.

Figure 33:
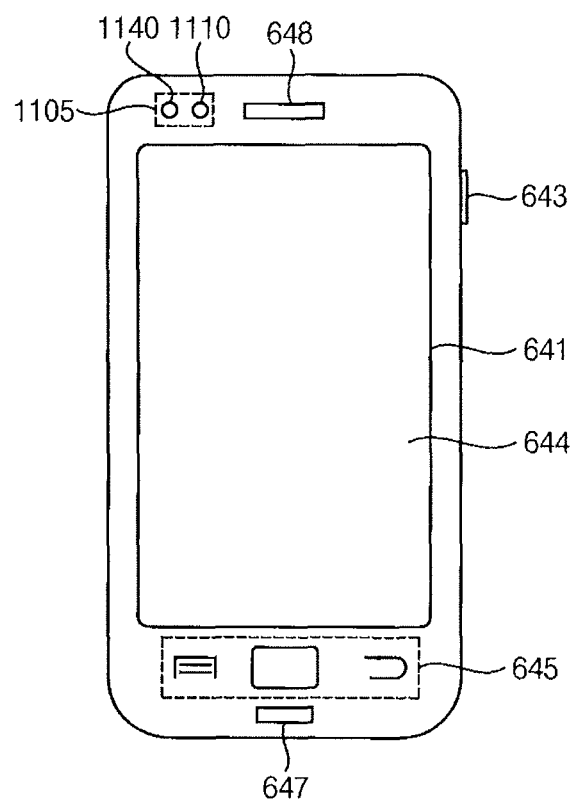
FIG. 33 illustrates another embodiment of a mobile system.

FIG. 33 illustrates another embodiment of a mobile system 1100 which includes an image sensor 1105 and a display device 641. The mobile system 1100 may further include a touch screen 644, buttons 643 and 645, a microphone 647, and a speaker 648.

The image sensor 1105 is installed on a first surface (for instance, a front surface) of the mobile system 1100. The image sensor 1105 performs a first sensing operation to detect proximity of a subject, a second sensing operation to recognize a gesture of the subject by acquiring distance information for the subject, and a third sensing operation to acquire color image information for the subject. The image sensor 1105 may include a sensing unit 1110 having a plurality of depth pixels and color pixels and a light source unit 1140 to emit infrared light or near-infrared light.

In the example embodiment of FIG. 33, a 3D image sensor and a 2D image sensor may be prepared as one integrated circuit chip. That is, the mobile system 1100 may include one sensing module. In this case, the depth pixels and the color pixels may constitute one pixel array. In detail, the image sensor 1105 may be a 3D color image sensor, for instance, an RGBZ sensor. In the depth pixels and the color pixels, at least one of the first and second portions of the transfer gate in a longitudinal direction does not overlap the isolation region, to thereby suppress generation of noisy electrons and to enhance dark characteristic.

The display device 641 is installed on the first surface of the mobile system 1100 to display the results of the first sensing, the second sensing and the third sensing operation.

The mobile system 1100 of FIG. 33 is substantially identical to the mobile system 600 of FIG. 27, except that the 3D image sensor and the 2D image sensor of the mobile system 1100 are prepared as one integrated circuit chip and the depth pixels and the color pixels constitute one pixel array.

Figure 34:
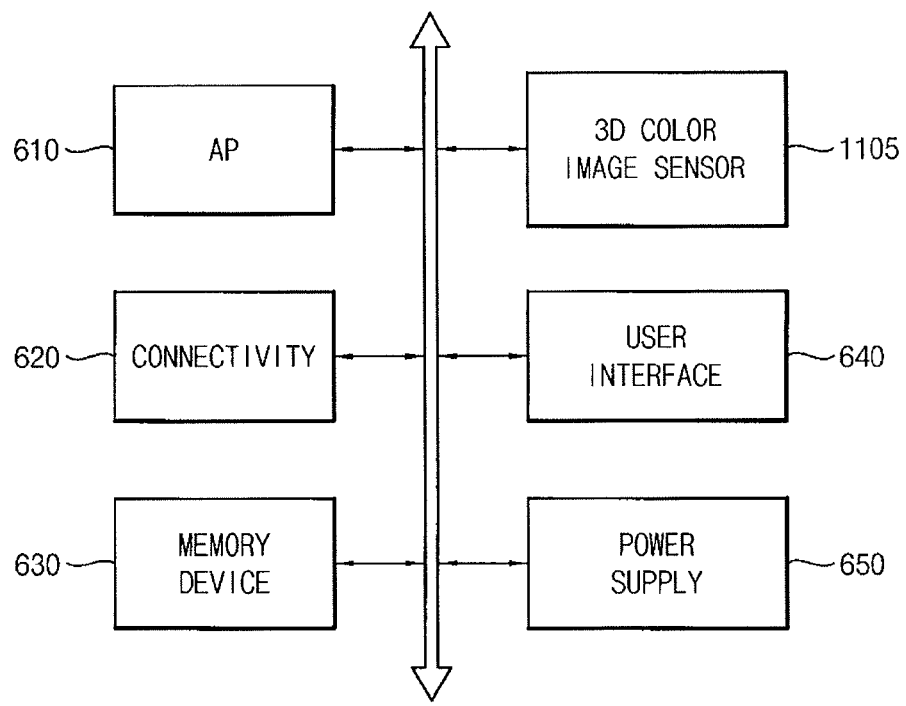
FIG. 34 illustrates an internal configuration of the mobile system in FIG. 33.

FIG. 34 illustrates an internal configuration of the mobile system shown in FIG. 33. Referring to FIG. 34, the mobile system 1100 includes an application processor 610, a connectivity unit 620, a memory device 630, an image sensor 1105, a user interface 640, and a power supply 650.

When comparing with the mobile system 600 of FIG. 28, the mobile system 1100 of FIG. 34 may further include the 3D color image sensor 1105. The 3D image sensor and the 2D image sensor are integrated and a plurality of depth pixels and color pixels constitute one pixel array. The image sensor 1105 may perform the first sensing operation, the second sensing operation, and the third sensing operation. For instance, the image sensor 1105 may primarily perform the first sensing operation, and at least one of the second sensing operation and the third sensing operation may be performed based on the result of the first sensing.

Figure 35:
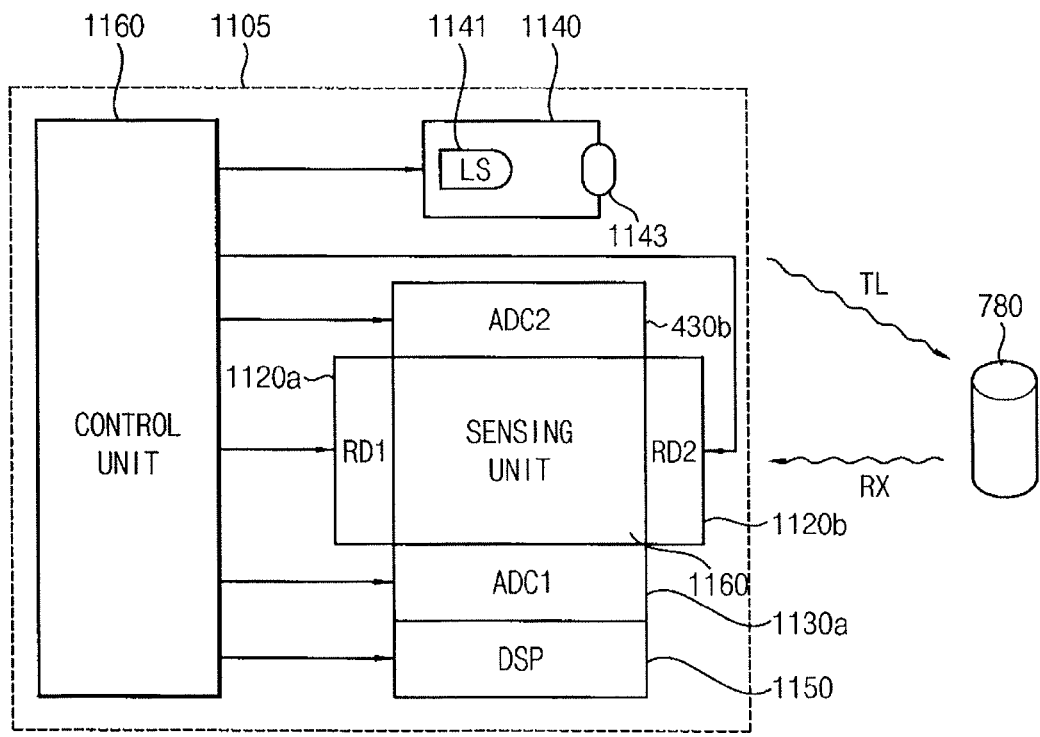
FIG. 35 illustrates an image sensor in the mobile system of FIG. 34.
Figure 36:
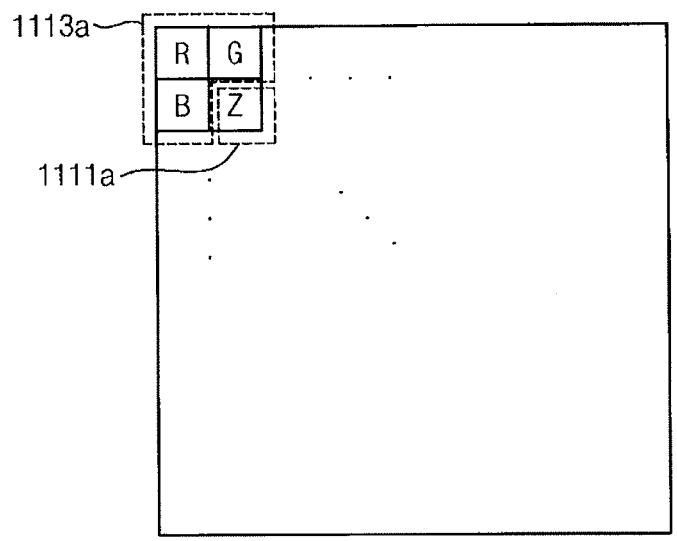
FIGS. 36 and 37 illustrate examples of sensing units in the image sensor in FIG. 35.
Figure 37:
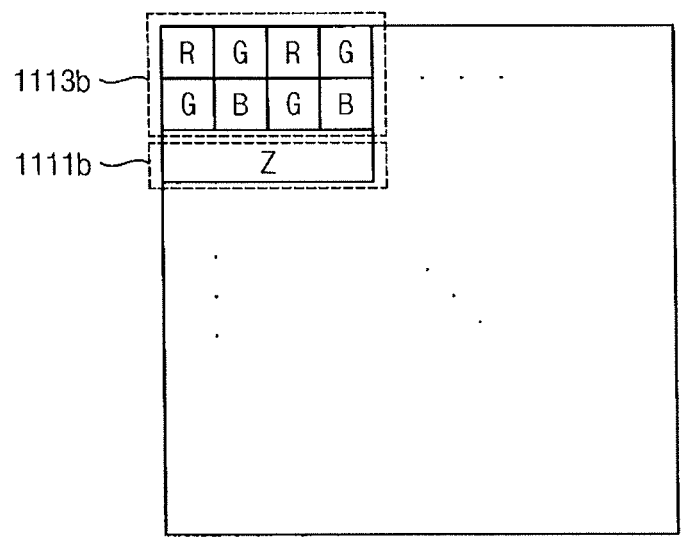

FIG. 35 illustrates an embodiment of an image sensor included in the mobile system shown in FIG. 34, and FIGS. 36 and 37 illustrate examples of sensing units included in the image sensor shown in FIG. 35.

Referring to FIG. 35, the mage sensor 1105 may include a sensing unit 1110, a first row driving unit 1120a, a first ADC (Analog-to-Digital Converting) unit 1130a, a second ADC unit 1130b, a light source unit 1140, a DSP (Digital Signal Processing) unit 1150, and a control unit 1160.

The light source unit 1140 may output light TL having a predetermined wavelength (for instance, infrared light or near-infrared light). The light source unit 1140 may be selectively activated or emit lights having mutually different brightness according to the operation mode. The light source unit 1140 may include a light source 1141 to generate the light TL and a lens 1143 to concentrate the light onto the subject 180.

The sensing unit 1110 may provide distance information by receiving light RX reflected from the subject 180 and converting the light RX into an electric signal. In addition, the sensing unit 1110 may provide color image information by converting incident light (for instance, visible light) into an electric signal.

The sensing unit 1110 may include a plurality of depth pixels and color pixels. According to example embodiments, the depth pixels and color pixels may be included in the sensing unit 1110 with various number ratios and size ratios. For instance, a sensing unit 1110a may include depth pixels 1111a and color pixels 1113a as shown in FIG. 36, or a sensing unit 1110b may include depth pixels 1111b and color pixels 1113b as shown in FIG. 37.

In one example embodiment, an infrared filter (or near-infrared filter) is formed over the depth pixels and color filters (for instance, red, green, and blue filters) are formed over the color pixels. In the depth pixels and the color pixels, at least one of the first and second portions of the transfer gate in a longitudinal direction does not overlap the isolation region, to thereby suppress generation of noisy electrons and to enhance dark characteristic.

The first row driving unit 1120a is connected to each row of the color pixels and may generate a first driving signal to drive each row of the color pixels. The second row driving unit 1120b is connected to each row of the depth pixels and may generate a second driving signal to drive each row of the depth pixels. The first ADC unit 1130a is connected to each column of the color pixels and may convert a first analog signal output from each column of the color pixels into a first digital signal. The second ADC unit 1130b is connected to each column of the depth pixels and may convert a second analog signal output from each column of the depth pixels into a second digital signal.

The DSP unit 1150 receives the first and second digital signals output from the first and second ADC units 1130a and 1130b to perform the image data processing with respect to the first and second digital signals.

The control unit 1160 may control the first row driving unit 1120a, the second row driving unit 1120b, the first ADC unit 1130a, the second ADC unit 1130b, the light source unit 1140 and the DSP unit 1150.

Figure 38:
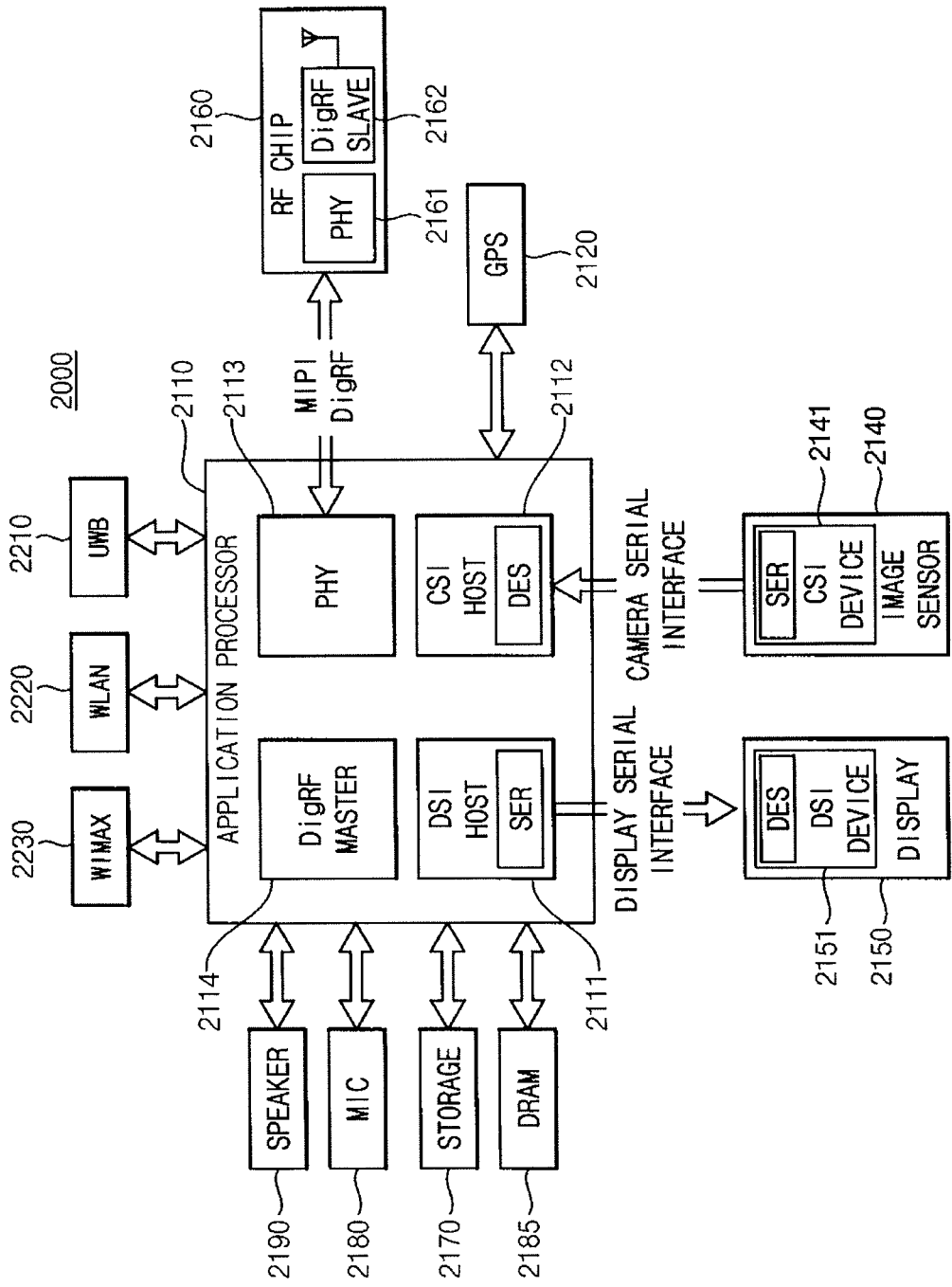
FIG. 38 illustrates an embodiment of an interface in a mobile system.

FIG. 38 illustrates an embodiment of an interface that may be used in a mobile system 2000. Referring to FIG. 38, the mobile system 2000 may be implemented as a data processing device (for instance, a portable phone, a personal digital assistant, a portable multimedia player, or a smart phone) that uses or supports an MIPI interface, and may include an application processor 2110, an image sensor 2140, and a display 2150.

A CSI host 2112 of the application processor 2110 can make serial communication with a CSI device 2141 of the image sensor 2140 through a camera serial interface (CSI). In one embodiment, the CSI host 2112 may include an optical serializer DES and the CSI device 2141 may include an optical serializer SER.

A DSI host 2111 of the application processor 2110 can make serial communication with a DSI device 2151 of the display 2150 through a display serial interface (DSI). In one embodiment, the DSI host 2111 may include an optical serializer SER and the DSI device 2151 may include an optical serializer DES.

In addition, the mobile system 2000 may further include an RF (radio frequency) chip 2160 to communicate with the application processor 2110. Data may be transceived between a PHY 2113 of the mobile system 2000 and a PHY 2161 of the RF chip 2160 according to the MIPI (Mobile Industry Processor Interface) DigRF. In addition, the application processor 2110 may include a DigRF MASTER 2114 to control data transmission according to the MIPI DigRF. The RF chip 2160 may also include a DigRF SLAVE 2162 which is controlled by the DigRF MASTER 2114.

Meanwhile, the mobile system may include a GPS (Global Positioning System) 2120, a storage 2170, a microphone 2180, a DRAM (Dynamic Random Access Memory) 2185, and a speaker 2190. In addition, the mobile system 2000 can perform the communication using a UWB (Ultra WideBand) 2210, a WLAN (Wireless Local Area Network) 2220, and/or a WIMAX (Worldwide Interoperability for Microwave Access) 2230. The structure and the interface of the mobile system 2000 are illustrative purposes only and example embodiments may not be limited thereto.

Example embodiments can be applied to the 3D image sensor capable of performing proximity sensing and gesture recognition and the mobile system including the same. For instance, example embodiments can be applied to various terminals, such as a mobile phone, a smart phone, a tablet PC, a laptop computer, a personal digital assistant (PDA), a portable multimedia player (PMP), a digital camera, a music player, a portable game console, or a navigation system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A unit pixel of an image sensor, the unit pixel comprising:
 a photoelectric conversion region in an active region defined by an isolation region of a semiconductor substrate, the photoelectric conversion region to generate electric charges corresponding to incident light;
 a floating diffusion region in the active region; and
 a transfer gate to transfer the electric charges to the floating diffusion region, the transfer gate adjacent to the photoelectric conversion region and the floating diffusion region, the transfer gate including first and second portions divided relative to a reference line in a direction from the photoelectric conversion region to the floating diffusion region, wherein at least one of the first and second portions does not overlap the isolation region.

2. The unit pixel as claimed in claim 1, wherein the active region comprises:
 a first section having a corner-cut foursquare or rectangular shape; and
 a second section having a rectangular shape that extends in the direction from a corner-cut edge of the first section.

3. The unit pixel as claimed in claim 2, wherein the reference line divides the first and second sections equally in the direction, and wherein the transfer gate is symmetrically arranged with respect to the reference line.

4. The unit pixel as claimed in claim 3, wherein the first and second portions of the transfer gate do not overlap the isolation region.

5. The unit pixel as claimed in claim 2, wherein the reference line divides the first and second sections equally in the direction, and the transfer gate is asymmetrically arranged with respect to the reference line.

6. The unit pixel as claimed in claim 5, wherein the first portion of the transfer gate partially overlaps the isolation region and the second portion of the transfer gate does not overlap the isolation region.

7. The unit pixel as claimed in claim 5, wherein the first portion of the transfer gate does not overlap the isolation region and the second portion of the transfer gate partially overlaps the isolation region.

8. The unit pixel as claimed in claim 2, wherein the first section includes the photoelectric conversion region.

9. The unit pixel as claimed in claim 2, wherein the second section includes the floating diffusion region.

10. The unit pixel as claimed in claim 2, wherein:
 the photoelectric conversion region is doped with impurities of a second conductivity type, and the semiconductor substrate is doped with impurities of a first conductivity type different from the second conductivity type.

11. The unit pixel as claimed in claim 1, wherein the transfer gate is on a first surface of the semiconductor substrate.

12. The unit pixel as claimed in claim 11, further comprising:
a color filter above the transfer gate and corresponding to the photoelectric conversion region; and
a micro lens on the color filter and corresponding to the photoelectric conversion region.

13. The unit pixel as claimed in claim 1, wherein:
the transfer gate is on a first surface of the semiconductor substrate, and
the unit pixel includes:
a color filter on a second surface of the semiconductor substrate, the color filter corresponding to the photoelectric conversion region; and
a micro lens on the color filter, the micro lens corresponding to the photoelectric conversion region.

14. A unit pixel of an image sensor, the unit pixel comprising:
a floating diffusion region in an active region defined by an isolation region of a semiconductor substrate;
a plurality of photoelectric conversion regions on the active region which is shared by the floating diffusion region, the photoelectric conversion regions to generate electric charges corresponding to incident light; and
a plurality of transfer gates to transfer the electric charges to the floating diffusion region, the transfer gates adjacent to the photoelectric conversion regions and the floating diffusion region, each of the transfer gate including first and second portions divided relative to a reference line in a direction from the photoelectric conversion region to the floating diffusion region, wherein at least one of the first and second portions does not overlap the isolation region.

15. The unit pixel as claimed in claim 14, wherein:
the plurality of photoelectric conversion regions includes first and second photoelectric conversion regions,
the active region includes:
a first section including the first photoelectric conversion region;
a second section including the first photoelectric conversion region; and
a third section including the floating diffusion region and which is adjacent to the first and second sections, and
the plurality of transfer gates includes:
a first transfer gate to transfer first electric charges in the first photoelectric conversion region to the floating diffusion region; and
a second transfer gate to transfer second electric charges in the second photoelectric conversion region to the floating diffusion region.

16. The unit pixel as claimed in claim 15, wherein:
the first and second transfer gates respectively receive first and second transfer control signals in a read operation mode, the first and second transfer control signals having different activation intervals.

17. The unit pixel as claimed in claim 14, wherein:
the plurality of photoelectric conversion regions include first through fourth photoelectric conversion regions that are adjacent to each other in a two-by-two matrix form,
the active region includes:
a first section including the first photoelectric conversion region;
a second section including the second photoelectric conversion region;
a third section including the third photoelectric conversion region;
a fourth section including the fourth photoelectric conversion region; and
a fifth section including the floating diffusion region, the fifth section adjacent to the first through fourth sections.

18. The unit pixel as claimed in claim 17, wherein the plurality of transfer gates comprises:
a first transfer gate to transfer first electric charges in the first photoelectric conversion region to the floating diffusion region;
a second transfer gate to transfer second electric charges in the second photoelectric conversion region to the floating diffusion region;
a third transfer gate to transfer third electric charges in the third photoelectric conversion region to the floating diffusion region; and
a fourth transfer gate to transfer fourth electric charges in the fourth photoelectric conversion region to the floating diffusion region.

19. A unit pixel of an image sensor, the unit pixel comprising:
a photoelectric conversion region in an active region defined by an isolation region of a semiconductor substrate, the photoelectric conversion region to generate first electric charges to detect a distance from an object and second electric charges to detect a color of the object;
a plurality of floating diffusion regions in the active region; and
a plurality of transfer gates to transfer the first and second electric charges to the floating diffusion regions, the transfer gates adjacent to the photoelectric conversion regions and the floating diffusion region, each of the transfer gate including first and second portions divided relative to a reference line in a direction from the photoelectric conversion region to the floating diffusion region, wherein at least one of the first and second portions does not overlap the isolation region.

20. The unit pixel as claimed in claim 19, wherein the active region comprises:
a first section having an eight-sided shape including four cut corners; and
second through fifth sections having a rectangular shape, each of the second through fifth sections extending in a first or second diagonal direction relative to a respective one of the four corner-cut edges of the first section,
the first section includes the photoelectric conversion region, and
the second through fifth sections respectively include the first through fourth floating diffusion regions.

21. The unit pixel as claimed in claim 20, wherein the plurality of transfer gates comprises:
a first transfer gate to transfer electric charges in the photoelectric conversion region to the first floating diffusion region;
a second transfer gate to transfer the electric charges in the photoelectric conversion region to the second floating diffusion region;
a third transfer gate to transfer the electric charges in the photoelectric conversion region to the third floating diffusion region; and a fourth transfer gate to transfer the electric charges in the photoelectric conversion region to the fourth floating diffusion region, and wherein the first and the second floating diffusion regions are to generate at least a depth signal to detect the distance from the object and wherein the third and fourth floating diffusion regions are to generate a color signal to detect the color of the object, and wherein the first and second floating diffusion regions are symmetrically arranged with respect to the first diagonal direction, and wherein the third and fourth floating diffusion regions are symmetrically arranged with respect to the second diagonal direction.

22. A unit pixel of an image sensor, the unit pixel comprising:
a substrate including an active region and an isolation region;
a photoelectric conversion region, in the active region, to generate electric charges from incident light;
a floating diffusion region in the active region; and
a transfer gate between the photoelectric conversion region and the floating diffusion region, the transfer gate including a first area and a second area, wherein an axis through the photoelectric conversion region passes between the first and second area, and wherein at least one of the first and second areas does not overlap the isolation region.

23. The unit pixel as claimed in claim 22, wherein the first area and the second area are substantially equal.

24. The unit pixel as claimed in claim 22, wherein the first area is different from the second area.

25. The unit pixel as claimed in claim 22, wherein:
the photoelectric conversion region includes first and second points,
a distance between the first and second points is equal to or greater than a distance between any two other points in the photoelectric conversion region, and
the axis passes through the first and second points.

26. The unit pixel as claimed in claim 22, wherein the floating diffusion region is coupled to the photoelectric conversion region through the transfer gate and is coupled to another photoelectric conversion region through another transfer gate.

27. The unit pixel as claimed in claim 1, wherein at least one of the first and second portions does not extend beyond the active region.

* * * * *